United States Patent [19]
Kamon

[11] Patent Number: 5,369,464
[45] Date of Patent: Nov. 29, 1994

[54] EXPOSURE APPARATUS AND AN EXPOSURE METHOD USING THE SAME

[75] Inventor: Kazuya Kamon, Hyogo, Japan

[73] Assignee: Mitsubishi Denki Kabushiki Kaisha, Tokyo, Japan

[21] Appl. No.: 91,870

[22] Filed: Jul. 14, 1993

[30] Foreign Application Priority Data

Jul. 14, 1992 [JP] Japan ................... 4-186843
Mar. 23, 1993 [JP] Japan ................... 5-063947

[51] Int. Cl.$^5$ ............... G03B 27/52; G03B 27/70; G03B 27/42
[52] U.S. Cl. ............................ 355/43; 355/53
[58] Field of Search .................. 355/43, 53, 77

[56] References Cited

U.S. PATENT DOCUMENTS

| | | | |
|---|---|---|---|
| 4,295,735 | 10/1981 | Lacombat et al. | 355/43 |
| 4,422,753 | 12/1983 | Pryor | 355/43 |
| 4,769,680 | 9/1988 | Resor, III et al. | 355/43 |
| 4,860,061 | 8/1989 | Ikeda | 355/43 |
| 4,869,998 | 9/1989 | Eccles et al. | 355/53 X |
| 4,878,086 | 10/1989 | Isohata et al. | 355/77 |
| 5,117,254 | 5/1992 | Kawashima et al. | 355/43 |

*Primary Examiner*—Richard A. Wintercorn
*Attorney, Agent, or Firm*—Lowe, Price, LeBlanc & Becker

[57] ABSTRACT

An exposure apparatus includes a first reflective type photomask 18a, a first mask stage 180a for mounting the first reflected type photomask 18a, a second reflective type photomask 18b, and a second mask stage 180b for mounting the second reflective type photomask 18b. Light 11a from a light source 11 is directed to the first and second reflective type photomasks 18a and 18b. The first exposure light 110c and the second exposure light 110b reflected by the first and second reflective type photomasks 18a and 18b are merged by a half mirror 30 to form a third exposure light 110e to expose a resist film 21a on a semiconductor substrate 21.

24 Claims, 27 Drawing Sheets

LIGHT AMPLITUDE

LIGHT AMPLITUDE

LIGHT INTENSITY ON WAFER

LIGHT AMPLITUDE

LIGHT AMPLITUDE

LIGHT INTENSITY ON WAFER

FIG.5B  LIGHT AMPLITUDE

FIG.5C  LIGHT AMPLITUDE

FIG.5D  LIGHT INTENSITY ON WAFER

LIGHT AMPLITUDE

LIGHT AMPLITUDE

LIGHT INTENSITY ON WAFER

FIG. 7B  LIGHT AMPLITUDE

FIG. 7C  LIGHT AMPLITUDE

FIG. 7D  LIGHT INTENSITY ON WAFER

FIG.8B LIGHT AMPLITUDE

FIG.8C LIGHT AMPLITUDE

FIG.8D LIGHT INTENSITY ON WAFER

LIGHT AMPLITUDE

LIGHT AMPLITUDE

LIGHT INTENSITY ON WAFER

FIG. 11B  LIGHT AMPLITUDE

FIG. 11C  LIGHT AMPLITUDE

FIG. 11D  LIGHT INTENSITY ON WAFER

FIG. 12A
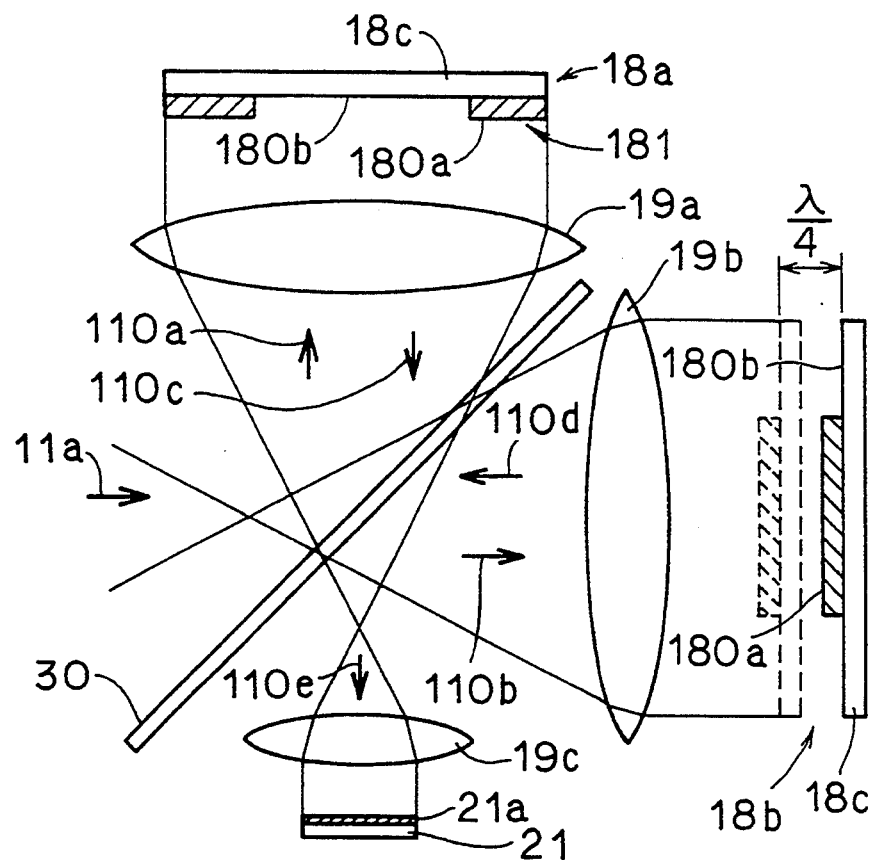
FIG. 12B
LIGHT AMPLITUDE
FIG. 12C
LIGHT AMPLITUDE
FIG. 12D
LIGHT INTENSITY ON WAFER
FIG. 12E
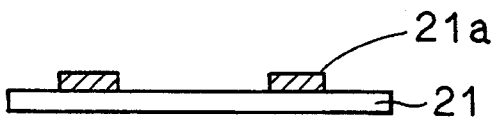

LIGHT AMPLITUDE

LIGHT AMPLITUDE

LIGHT AMPLITUDE

LIGHT AMPLITUDE

LIGHT AMPLITUDE

LIGHT INTENSITY ON WAFER

LIGHT AMPLITUDE

LIGHT AMPLITUDE

LIGHT INTENSITY ON WAFER

LIGHT AMPLITUDE

LIGHT AMPLITUDE

LIGHT INTENSITY ON WAFER

EXPOSURE APPARATUS AND AN EXPOSURE METHOD USING THE SAME

BACKGROUND OF THE INVENTION

1. Field of the Invention

The present invention relates to an exposure apparatus and an exposure method using that exposure apparatus. Particularly, the present invention relates to an exposure apparatus that allows negative type and positive type exposure using the same mask and that allows multi-focus points and multi-exposure with improved resolution in exposure, and an exposure method using that exposure apparatus.

2. Description of the Background Art

In recent years, semiconductor integrated circuits of large capacity and multiple functions can be obtained economically by combining and forming critical and complex patterns. Advance in the manufacturing technique is continuously sought for reducing the pattern dimension within a semiconductor integrated circuit.

Critical patterns in the manufacturing process of a semiconductor integrated circuit is achieved by photolithography. This photolithography technique requires a resist film to be formed on a semiconductor substrate.

This resist film is made of organic macromolecule that reacts with light, and is formed as a uniform thin film by a spin coating method or the like on a semiconductor substrate that will be subjected to a patterning process. The resist film is subjected to thermal treatment, whereby the organic solvent in the resist film is evaporated, the stress in the resist film removed, and adhesion of the resist film to the semiconductor substrate increased.

Then, the face of the resist film is exposed by light set to a wavelength for the resist film to be photo-sensitized. Exposure is carried out where an original image (mask) having a predetermined circuit pattern formed is directly adhered to the resist film, or where a projection method is used to form an image of the pattern of the mask onto a semiconductor substrate.

The exposed resist film absorbs light energy to exhibit chemical change. The causes a change in the molecular weight of the resist film. There are two types of the molecular weight change, one in which the macromolecule chain of the resist film composition material is severed to be reduced in molecular weight, and the other in which cross linking reaction occurs between macromolecule chains to be increased in molecular weight.

The former is called a positive type resist having the portion exposed to light removed in the developing process. The latter is called a negative type resist having the portion exposed to light remaining in the developing process.

In current technique, a positive type resist is characterized in that a defect is easily generated but the pattern accuracy is good. The negative type resist is characterized in that a defect is not easily generated but the pattern accuracy is poor. The resists of respective types are used according to their application.

The structure of a conventional exposure apparatus will be described hereinafter with reference to FIG. 17.

Referring to FIG. 17, an exposure apparatus includes a mercury lamp 11 which is the light source, a reflecting mirror 12, a focused lens 20, a fly eye lens 13, a diaphragm 14, focused lens 16a, 16b, 16c, a diaphragm 15, a reflecting mirror 17, a photomask 18, projection lens 19a, 19b, and a diaphragm 25.

The light 11a emitted from mercury lamp 11 has only the g-line (436 nm), for example, reflected by reflecting mirror 12 to result in a unit wave length. Light 11a enters each fly eye forming lens 13a of fly eye lens 13 to pass through diaphragm 14.

In FIG. 17, light 11b indicates a light path generated by one fly eye forming lens 13a, and light 11c indicates a light path generated by fly eye lens 13. Light 11a passes focused lens 16a, diaphragm 15, and focused lens 16b to reflecting mirror 17, whereby only light 11a of a unit wave length of g-line (436 nm) is reflected.

Then, light 11a passes focused lens 16c to be directed in uniformly to the surface of photomask 18 having a predetermined pattern formed. Light 11a is reduced to a predetermined magnification by projection lens 19a and 19b to expose a resist film 21a on a semiconductor wafer 21.

In the case of a positive type resist film, the portion exposed to light will be removed during the developing process. In the drawing, light 11d indicates diffraction light of zero degree, and light 11e and light 11f indicate diffraction light of ± one degree.

A trend for a more critical exposure dimension is recently noticeable. The need arises for further improving the pattern resolution in a semiconductor device. A phase shift method is known for this purpose in which a phase difference is established for light passing a photomask to improve the light intensity profile. Such a phase shift method will be described hereinafter with reference to FIG. 18A-18D and FIGS. 19A-19D.

Referring to FIG. 18A, a conventional photomask 18 for forming a line-and-space pattern includes a light shielding portion 18d formed using light shielding material such as chrominium, molybdenum, or silicide, and a light transmitting portion 18c on a transparent mask substrate 18a such as of quartz substrate. A repeated pattern of a line-and-space is formed to serve as a mask pattern 18 for exposure.

The intensity distribution of light (A1) right after passing resist pattern 18 can be appreciated from FIG. 18B where light is 0 at light shielding portion 18d, and light completely passes through light transmitting portion 18c.

Taking one light transmitting portion 18c as an example, the light (A2) provided to the resist film has an amplitude with a hill-like maximum at both trailing edges thereof due to diffraction as shown in FIG. 18C. The light passing through an adjacent light transmitting portion 18c is shown by the chain dotted line A2'.

When light from each light transmitting portion 18c is gathered, the light intensity distribution will lack sharpness as shown by the solid line A3 in FIG. 18D. This will cause an unsharp image due to diffraction, so that a sharp exposure can not be accomplished.

This problem can be solved by providing a phase shifter 23 on every other light transmitting portion 18c of the repetitive pattern as shown in FIG. 19A. Unsharpness due to diffraction is canceled by inversion of the phase, whereby a sharp image is transferred to improve the resolution.

When phase shifter 23 provided on one light transmitting portion 18c is such that applies a phase difference of 180°, for example, to light, the light passing through phase shifter 23 is inverted as shown in B1 in FIG. 19B. The light passing through light transmitting portion 18c is not inverted since it does not go through phase shifter 23.

The light applied to the resist film will be inverted to cancel each other at the edge of the light intensity distribution thereof at a position indicated by B2 in FIG. 19C. Therefore, the light distribution applied to the resist film will exhibit an ideal shape as shown by B3 in FIG. 19D.

This method of providing a phase shifter 23 at every other line-and-space is called a Robinson type phase shifter method.

Another conventional example using a phase shifter method will be described hereinafter.

An auxiliary shifter type phase shifter method will be described with reference to FIGS. 20A–20E.

Referring to FIG. 20A, a photomask is providing including a light transmitting portion 18c and light transmitting portions 18e and 18e of a small opening width at both sides of light transmitting portion 18c on a quartz mask substrate 18a. A phase shifter 23 applying a phase difference of 180° is provided at light transmitting portions 18e, 18e.

When light is directed to photomask 18 of the above-described structure, the light passing through light transmitting portion 18c has an amplitude of a mountain shape with extending trailing edges as shown in FIG. 20B. The light passing through phase shifter 23 shows an amplitude of two small mountains on the resist film as shown in FIG. 20C.

The light intensity on the resist film results in the overlap of the 2 light amplitudes as shown in FIG. 20D.

The light distribution shows a sharp mountain configuration with the extension of the edges suppressed, so that unsharpness due to diffraction is canceled. It is therefore possible to form a resist film 21a having a sharp image on a semiconductor wafer 21 as shown in FIG. 20E.

A self-alignment type phase shifter method will be described hereinafter with reference to FIG. 21A–21E.

Referring to FIG. 21A, a light transmitting portion 18c and a light shielding portion 18d are formed on a quartz mask substrate 18a. A phase shifter 23 applying a phase difference of 180° to the transmitting light is provided at the boundary of light transmitting portion 18c and light shielding portion 18d.

When light is directed to photomask 18 of the above-described structure, the light passing through light transmitting portion 18c shows an amplitude of a mountain with extending edges on a resist film as shown in FIG. 21B.

The light passed through phase shifter 23 shows an amplitude of two small mountains with a gentle slope at the trailing edges on a resist film as shown in FIG. 21C.

Therefore, the light intensity on a resist film results in the overlap of the above-described two light amplitudes. The light intensity distribution shows a sharp mountain with the extension of the trailing edges suppressed.

Thus, a resist film 21a having a sharp image can be formed on a semiconductor wafer 21, as shown in FIG. 21E.

A halftone type phase shift method will be described hereinafter with reference to FIGS. 22A–22E.

Referring to FIG. 22A, a light transmitting portion 18c and a light shielding portion 18d are formed on a quartz mask substrate 18a. Light shielding portion 18d is formed of a material that transmits approximately 10% of the light. A phase shifter 23 providing a phase difference of 180° with respect to the transmitting light is provided on the upper face of light shielding portion 18d.

When light is directed to a photomask 18 of the above-described structure, light passing through light transmitting portion 18c shows an amplitude of a mountain configuration with extending edges on a resist film, as shown in FIG. 22B.

Approximately 10% of light going through light shielding portion 10d results in an amplitude of light having the phase inverted 180° on a resist film, as shown in FIG. 22C.

The light intensity on the resist film results in the overlap of the above-described two light amplitudes, as shown in FIG. 22D. It can be appreciated that light intensity is suppressed in the trailing edge of the mountain although approximately 10% of light intensity is seen at both edges.

It is therefore possible to form a resist film 21a having a sharp image on a semiconductor substrate 21 as shown in FIG. 22E.

Although the resolution is equal, the halftone type phase shift method is advantageous over the auxiliary shifter type and self-alignment type phase shifter method in that a complex phase shifter 23 does not have to be formed. A resist film can easily be formed just by providing a phase shifter 23 on a light shielding portion 18d transmitting approximately 10% of light.

A phase shift method of a shifter light shielding type I will be described hereinafter with reference to FIGS. 23A–23E.

Referring to FIG. 23A, a phase shifter 23 providing a phase difference of 180° to the transmitting light is provided at a predetermined interval on a quartz mask substrate 18a.

When light is directed to photomask 18 of the above-described structure, the light passing through the light transmitting portion 18c of quartz mask substrate 18a shows an amplitude reduced at portions corresponding to phase shifter 23 on the resist film, as shown in FIG. 23B.

The light passing through phase shifter 23 shows an amplitude having the phase inverted 180° on the resist film, as shown in FIG. 23C.

The light intensity on the resist film results in the overlap of the above-described two light amplitudes, where light intensity of substantially 0 is seen at the portions corresponding to each phase shifter 23, as shown in FIG. 23D.

Therefore, it is possible to form a resist film 21a having a configuration corresponding to phase shifter 23 on a semiconductor substrate 21, as shown in FIG. 23E.

A phase shift method of a shifter shielding light type II will be described hereinafter with reference to FIGS. 24A–24E.

Referring to FIG. 24A, a phase shifter 23 of a predetermined width and providing a phase difference of 180° with respect to the transmitting light is provided on a quartz mask substrate 18a.

When light is directed to photomask 18 of the above-described structure, light passing through light transmitting portion 18c on quartz mask substrate 18a will exhibit an amplitude as shown in FIG. 24B on a resist film. The light passing through phase shifter 23 exhibits an amplitude having the phase inverted 180° on the resist film, as shown in FIG. 24C.

The light intensity on the resist film is the overlap of the above-described 2 light amplitudes, as shown in FIG. 24D. The light intensity becomes substantially 0 at the portions corresponding to the opposite end portions of phase shifter 23.

Thus, it is possible to form a resist film 21a only at the areas corresponding to the two end portions of phase shifter 23, as shown in FIG. 24E.

A multi-step type phase shift method will be described hereinafter with reference to FIGS. 25A–25D.

Referring to FIG. 25A, a phase shifter 23b of a predetermined width providing a phase difference of 180° with respect to the transmitting light, and a phase shifter 23a providing a phase difference of 90° with respect to the transmitting light at one side of phase shifter 23b are provided on a quartz mask substrate 18a. There are transmitting portions 18c at both sides of phase shifters 23b and 23a.

The phase of light going through photomask 18 of the above-described configuration reaching the resist film is shown in FIG. 25B. The phase of light passing through phase shifter 23b, phase shifter 23a, and light transmitting portion 18c are indicated by (i), (ii), and (iii), respectively.

It can be appreciated from FIG. 25C showing the light intensity on the resist film that there is a portion that is not exposed at the interface of phase shifter 23b and light transmitting portion 18c caused by the light intensity reduced to substantially zero.

In contrast, the portion including phase shifter 23b, phase shifter 23a and light transmitting portion 18c will be exposed because the light intensity is never reduced to 0 on account of phase shifter 23a.

Thus, a resist film 21a as shown in FIG. 25D is formed in using photomask 18 of the above-described structure.

The problems of the above conventional methods are set forth in the following.

When a pattern identical to that of the photomask is to be transferred to a resist film, a positive type resist film is used. When the pattern of the photomask is inverted to be transferred to a resist film, a negative type resist film is used.

A positive type resist film is formed of a novolac resin type resist, and a negative type resist film is formed of a gum type resist. There is much constraint in usage thereof due to difference in their handling manners, effective developers, and developing methods.

When a projection type photomask is used as in the above-described conventional art, the exposure was adversely affected by defects found at the top and bottom surfaces of the photomask. The defect in the photomask had to be located and corrected which took a great period of time.

When a phase shift mask is used, it is difficult to find a defect since the phase shifter is formed of a transparent material. Furthermore, the manufacturing process of a phase shifter is a difficult one. When the pattern is irregular, the manufacturing process of the phase shifter would become very complicated.

Furthermore, there was a problem that a resist film could not be etched in a desired configuration when a stepped portion is generated on the semiconductor substrate on account of the focusing position differing within the same semiconductor substrate.

Exposing a resist film 51 on a semiconductor substrate 50 having a stepped portion will be described with reference to FIGS. 26A–26C.

FIG. 26A shows the case where the focusing position is set based on the resist film on a higher face portion 50a of semiconductor substrate 50 as the reference.

A hole 52 of a predetermined configuration can be formed in a resist film 51 on higher face portion 50a. In contrast, a hole 53 of imperfect configuration is formed in resist film 51 on the lower face portion 50b because that region is out of focus.

FIG. 26B shows the case where the focusing position is set to resist film 51 on lower face portion 50b of semiconductor substrate 50.

In this case, hole 53 of a predetermined configuration can be formed in resist film 51 on region 50b. However, hole 52 can not be formed with a desired configuration in resist film 51 on higher face portion 50a because the area does not have the apparatus depth of focus.

FIG. 26C shows the case where the focusing position is set to an area intermediate the portions of 50a and 50b in semiconductor substrate 50. In this case, holes 52 and 53 are formed imperfect in configuration because neither are in focus.

There is also a problem that holes of desired configuration can not be obtained informing holes of different depth in resist film 51 on the same semiconductor substrate. This is due to the fact that the exposure (amount of light) for forming respective holes differs.

This problem will be described in detail with reference to FIGS. 27A–27C.

FIG. 27A shows the case where the exposure is set based on a hole 52 smaller in depth. In this case, hole 52 will be formed in a predetermined configuration, but hole 53 will be imperfect in shape because the exposure is insufficient.

FIG. 27B shows the case where the exposure is set based on the deeper hole 53. In this case, hole 53 will be formed in a predetermined configuration, but hole 52 will be imperfect in configuration due to excessive exposure.

FIG. 27C shows the case where the exposure is set based on an intermediate depth of holes 52 and 53. In this case, holes 52 and 53 will both be imperfect in configuration.

SUMMARY OF THE INVENTION

An object of the present invention is to provide an exposure apparatus and an exposure method using the same that allows both positive type and negative type transfer using the same photomask.

Another object of the present invention is to provide an exposure apparatus and an exposure method using the same that can have the resolution of exposure improved without using a phase shifter.

A further object of the present invention is to provide an exposure apparatus and an exposure method using the same that allows at least 2 focus points and at least 2 different exposure amount in one exposure operation.

An exposure apparatus according to an aspect of the present invention includes a first mask stage for mounting a first photomask, a second mask stage for mounting a second photomask, a first light guiding unit for guiding the light pattern from the first photomask to a substrate to be exposed, and a second light guiding unit for guiding the light pattern from the second photomask to the substrate to be exposed.

According to the above-described exposure apparatus including the first and second light guiding units, the resolution of merged exposure light can be improved by establishing a predetermined phase difference between the phases of exposure light obtained from the first light guiding unit and exposure light from the second light guiding unit.

By differentiating the focusing position of the exposure light obtained from the first light guiding means from that of the exposure light obtained from the second light guiding unit, a resist film can be exposed by one irradiation even in the case where there are different focusing positions on the same substrate.

It is also possible to carry out exposure partially different in the exposure amount by one irradiation by directing one exposure light to a predetermined region of the region irradiated by other exposure light.

An exposure apparatus according to another aspect of the present invention includes a light source for emitting light for exposure, a half mirror for dividing the light emitted from the light source into a reflected light and transmitted light, a first mask stage located in the light path of the reflected light for mounting a first reflective type photomask having a predetermined pattern reflecting the reflected light to the substrate to be exposed, and a second mask stage located within the light path of the transmitted light for mounting a second reflective type photomask of a predetermined pattern reflecting the transmitted light to the substrate to be exposed.

This exposure apparatus includes first and second mask stages for mounting first and second reflective type photomasks, so that detection and correction of a defect in the photomask need to be carried out only at the reflecting face by using a reflective type photomask. The usage of a reflective type photomask allows reduction in the size of the exposure apparatus because the number of projection lens and the like can be reduced.

The resolution of merged exposure light can be improved by establishing a predetermined phase difference between the phases of the exposure light reflected on the first reflective mask and that on the second reflective mask.

By differentiating the focusing position of the exposure light reflected by the first reflective mask from that of the exposure light of the second reflective mask, the resist mask can be exposed by one irradiation even when the resist mask has different focusing positions on the same substrate.

Furthermore, it is possible to carry out exposure partially differing in exposure amount with one irradiation by directing one exposure light to a predetermined region of the region irradiated by another exposure light.

An exposure method according to the present invention includes the following steps.

First, light for exposure is emitted from a light source. This light is divided into a reflected light and a transmitted light by a half mirror.

The reflected light and the transmitted light are directed to a first reflective type photomask and a second reflective type photomask having a predetermined pattern, whereby a first exposure light and a second exposure light are formed by respective reflected light. The first exposure light and the second exposure light are directed to the half mirror again, whereby the first exposure light and the second exposure light are merged to form a third exposure light.

According to this exposure method, first and second exposure light are formed and then merged to form a third exposure light.

By establishing a predetermined phase difference between the phases of the first and second exposure light, the resolution of the merged third exposure light can be improved. By differentiating the focusing position of the first exposure light from that of the second exposure light, a resist film can be exposed by one irradiation even when the resist film has different focusing positions on the same substrate.

By directing the second exposure light to a predetermined region of the region irradiated by the first exposure light, exposure partially differing in exposure amount can be carried out by one irradiation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5B shows amplitude of the first exposure light on a semiconductor wafer according to the third embodiment.

FIG. 5C shows amplitude of the second exposure light on a semiconductor wafer according to the third embodiment.

FIG. 5D shows light intensity on a semiconductor wafer when the first exposure light and the second exposure light are merged according to the third embodiment.

FIG. 7B shows amplitude of the first exposure light on a semiconductor wafer according to the fifth embodiment.

FIG. 7C shows light amplitude of the second exposure light on a semiconductor wafer according to the fifth embodiment.

FIG. 7D shows light intensity on a semiconductor wafer when the first exposure light and the second exposure light are merged according to the fifth embodiment.

FIG. 8B shows amplitude of the first exposure light on a semiconductor wafer according to the sixth embodiment.

FIG. 8C shows amplitude of the second exposure light on a semiconductor wafer according to the sixth embodiment.

FIG. 8D shows light intensity on a semiconductor wafer when the first exposure light and the second exposure light are merged according to the sixth embodiment.

FIG. 11B shows amplitude of the first exposure light on a semiconductor wafer according to the ninth embodiment.

FIG. 11C shows amplitude of the second exposure light on a semiconductor wafer according to the ninth embodiment.

FIG. 11D shows light intensity on a semiconductor wafer when the first exposure light and the second exposure light are merged according to the ninth embodiment.

FIG. 12A schematically shows an exposure apparatus according to a tenth embodiment of the present invention.

FIG. 12B shows amplitude of the first exposure light on a semiconductor wafer according to the tenth embodiment.

FIG. 12C shows amplitude of the second exposure light on a semiconductor wafer according to the tenth embodiment.

FIG. 12D shows light intensity on a semiconductor wafer when the first exposure light and the second exposure light are merged according to the tenth embodiment.

FIG. 12E shows a pattern of the resist formed according to the tenth embodiment.

DESCRIPTION OF THE PREFERRED EMBODIMENTS

The structure and operation principle of an exposure apparatus according to the present invention will be described hereinafter with reference to the drawings.

Figure 1:
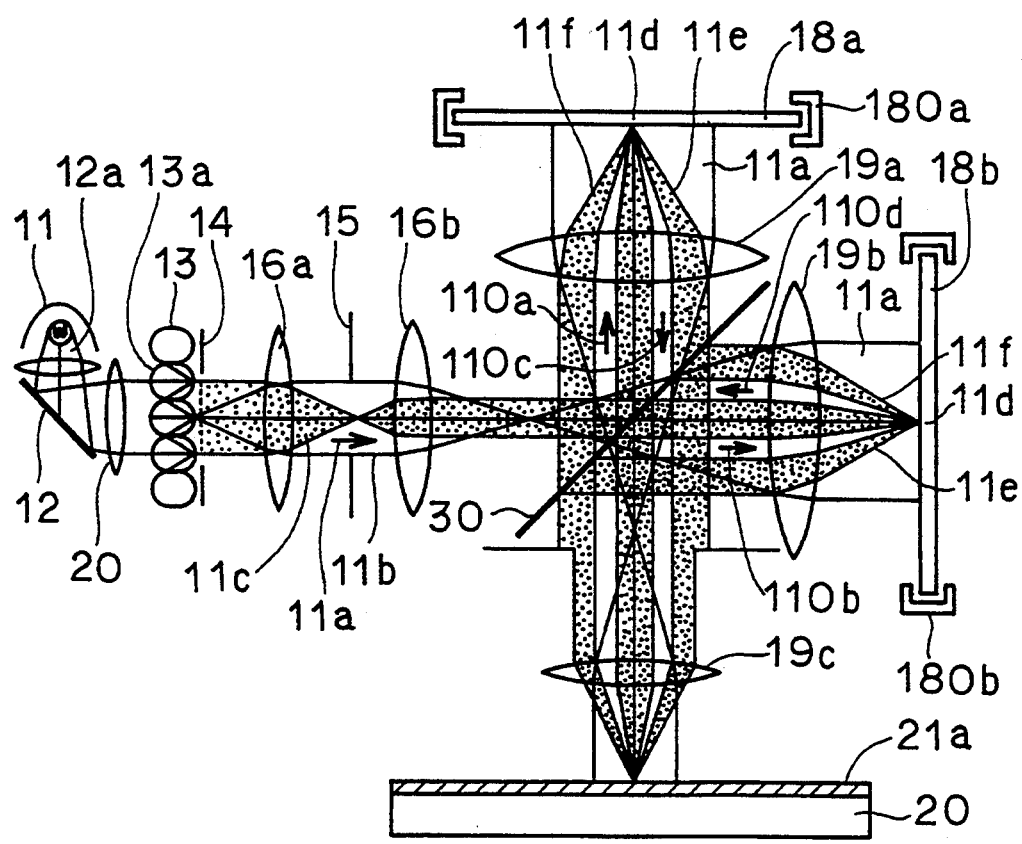
FIG. 1 schematically shows the structure of an exposure apparatus using a reflective type photomask according to the present invention.

Referring to FIG. 1, an exposure apparatus according to the present invention includes a mercury lamp 11 which is the light source, a reflecting mirror 12, a focused lens 20, a fly eye lens 13, a diaphragm 14, focused lens 16a and 16b, and a diaphragm 15. These components are similar to those of conventional art.

This exposure apparatus further includes a half mirror 30, projection lens 19a, 19b, 19c, a first mask stage 180a for mounting a first reflective type photomask 18a, and a second mask stage 180b for mounting a second reflective photomask 18b.

Half mirror 30 is arranged at an angle of 45° with respect to the optical axis of light 11a, such as a g-line (436 nm) emitted from a light source. First reflective type photomask 18a is mounted on first mask stage 180a to receive perpendicularly a first light 110a which is light 11a reflected by half mirror 30.

Second reflective type photomask 18b is mounted on second mask stage 180b so as to receive perpendicularly a second light 110b which is light 11a passing through half mirror 30.

Light 11a emitted from light source 11 is reflected 90° or directly passed through half mirror 30 to be divided into the first light 110a and the second light 110b. The proceeding direction of light in the drawing is indicated by arrows.

The first light 110a is reflected by a predetermined reflective pattern formed on first reflective type photomask 18a to become a first exposure light 110c. The second light 110b is reflected by a predetermined reflective pattern formed at second reflective type photomask 18b to become a second exposure light 110d.

The first and second exposure light 110c and 110d are divided again by half mirror 30 into a reflected light and a transmitted light. The transmitted light of the first exposure light 110c and the reflected light of the second exposure light 110d are merged to form a third exposure light 110e.

The third exposure light 110e is directed to a semiconductor wafer 21 by projection lens 19c to expose a resist film 21a on semiconductor wafer 21. Light 11d indicates light diffraction of zero degree, and light 11e and light 11f indicate diffraction light of ± one degree.

Exposure methods according to various embodiments using the above-described exposure apparatus will be described hereinafter. It is assumed that the resist film 21a provided on semiconductor wafer 21 in respective embodiments is a positive type resist having exposed portions removed. For the sake of simplicity, description of light 11d, 11e and 11f are omitted.

Figure 2A:
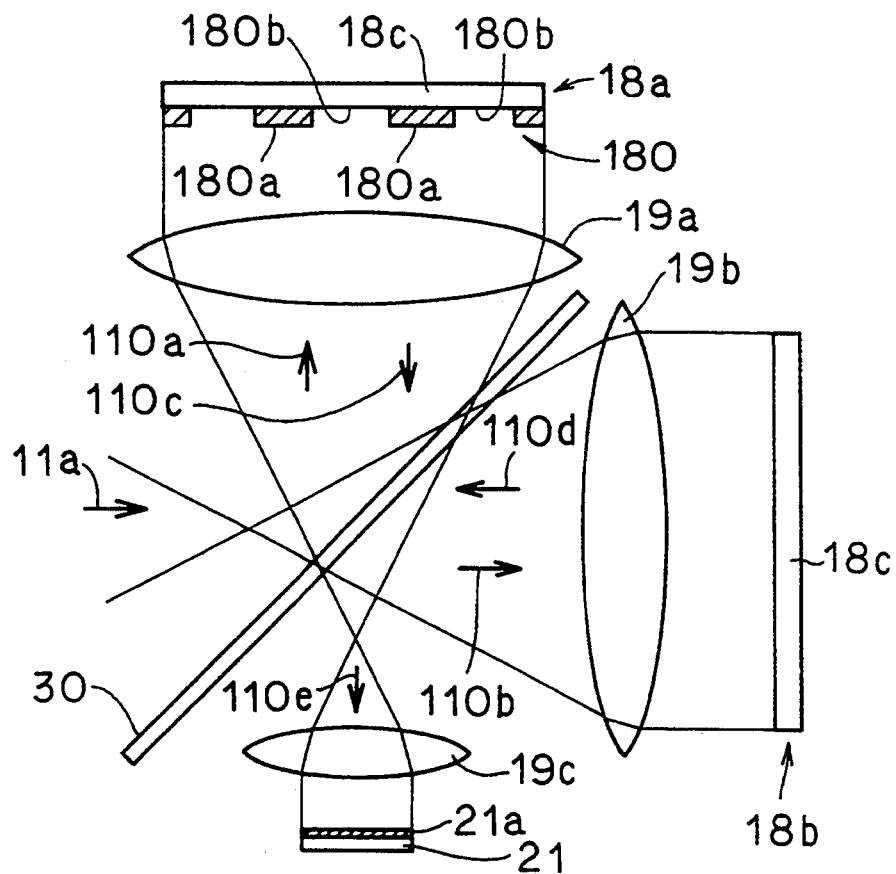
FIG. 2A schematically shows an exposure apparatus according to a first embodiment of the present invention.

A first embodiment will be described with reference to FIGS. 2A–E. Referring to FIG. 2A, a first reflective type photomask 18a has a reflective pattern formed of a reflecting portion 180a and a light transmitting portion 180b on a quartz mask substrate 18c. Reflecting portion 180a is formed of aluminum, for example.

A reflective pattern is not formed on quartz mask substrate 18c of second reflective type photomask 18b. All the light directed to second reflective type photomask 18b is passed through.

When the first and second reflective type photomasks 18a and 18b are used, light 11a emitted from the light source is reflected by half mirror 30 to become the first light 110a which is directed to first reflective type photomask 18a and reflected therefrom. The first exposure light 110c is formed by this reflected light.

Figure 2B:
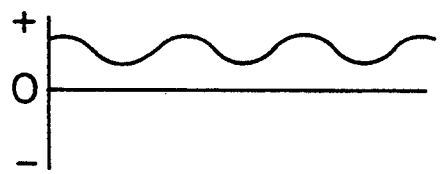
FIG. 2B shows amplitude of the first exposure light on a semiconductor wafer according to the first embodiment.

Amplitude of the first exposure light 110c on semiconductor wafer 21 is shown in FIG. 2B.

Figure 2C:
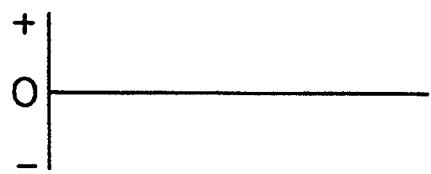
FIG. 2C shows amplitude of the second exposure light on a semiconductor wafer according to the first embodiment.

The second light 110b through half mirror 30 completely passes through second reflective type photomask 18b, so that the second exposure light 110d is such that has no amplitude, as shown in FIG. 2C.

Figure 2D:
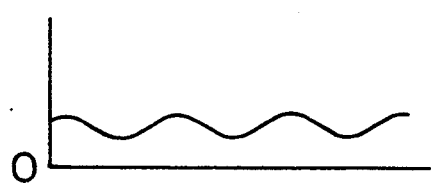
FIG. 2D shows light intensity on a semiconductor wafer when the first exposure light and the second exposure light are merged according to the first embodiment.
Figure 2E:
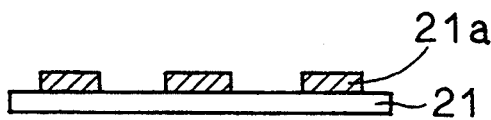
FIG. 2E shows a pattern of the resist formed according to the first embodiment.

Therefore, the third exposure light 110e formed by the merge of the first and second exposure light 110c and 110d by half mirror 30 results in light intensity on semiconductor wafer 21 as shown in FIG. 2D. Therefore, resist film 21a on semiconductor wafer 21 takes a resist pattern that is the inverted pattern of first reflective type photomask 18a.

Using the negative type resist film, a pattern which is an inversion of the photomask is transferred on to the semiconductor substrate. Thus, an effect can be obtained similar to the case where a positive type resist film is used.

A second embodiment will be described with reference to FIGS. 3A–3E.

Figure 3A:
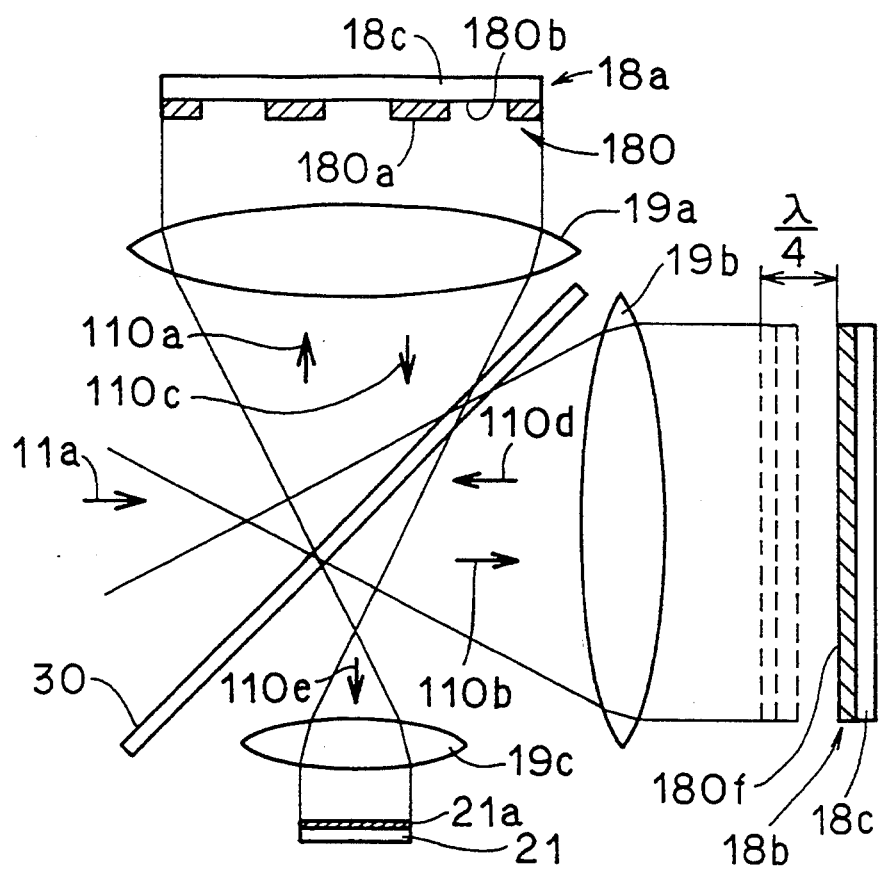
FIG. 3A schematically shows an exposure apparatus according to a second embodiment of the present invention.

Referring to FIG. 3A, a first reflective type photomask 18a has a reflective pattern 180 formed of a reflecting portion 180a and a transmitting portion 180b on a quartz mask substrate 18c. Reflecting portion 180a is formed of aluminum or the like.

A reflective pattern 180f is formed all over a quartz mask substrate 18c of a second reflective type photomask 18b. All the light directed to second reflective photomask 180b is reflected therefrom.

Second reflective type photomask 18b is disposed at a portion shifted by $\lambda/4$ as shown in FIG. 3A. This is for the purpose of providing a phase difference of $\lambda/2$ between light reflected on second reflective type photomask 18b and light reflected on first reflective type photomask 18a.

Thus, a light path difference of $\lambda/2$ is provided between the light reflected on the first reflective type photomask 18a and the light reflected on the second reflective type photomask 18b.

Figure 3B:
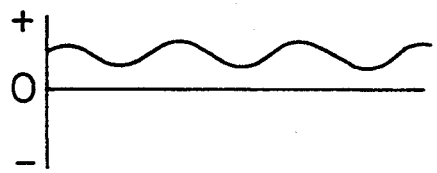
FIG. 3B shows amplitude of the first exposure light on a semiconductor wafer according to the second embodiment.
Figure 3C:
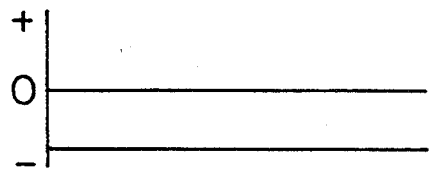
FIG. 3C shows amplitude of the second exposure light on a semiconductor wafer according to the second embodiment.

The second light 110a which is light 11a emitted from the light source and reflected by half mirror 30 is directed to first reflective type photomask 18a and reflected therefrom. The first exposure light 110c is formed by this reflected light. The first exposure light 110c on semiconductor wafer 21 has a light amplitude as shown in FIG. 3B.

The second light 110b passing through half mirror 30 is completely reflected by second reflective type photomask 18b, having the phase thereof converted by 180°. The second exposure light 110d is formed by this reflected light. The second exposure light 110d on the semiconductor wafer has a light amplitude shown in FIG. 3C.

Figure 3D:
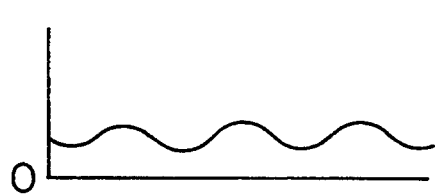
FIG. 3D shows light intensity on a semiconductor wafer when the first exposure light and the exposure light are merged according to the second embodiment.
Figure 3E:
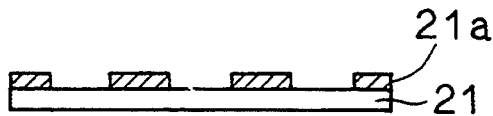
FIG. 3E shows a pattern of the resist formed according to the second embodiment.

Thus, the third exposure light 110e formed by the merge of the first and second exposure light 110c and 110d by half mirror 30 results in light intensity on semiconductor substrate 21 as shown in FIG. 3D.

Therefore, resist film 21a on semiconductor wafer 21 is identical to the resist pattern 180 of first reflective photomask 18a. Using the negative type resist film, a pattern identical to that of the photomask is transferred on to a semiconductor substrate.

According to the above-described first and second embodiments, transfer of a negative type and positive type can be transferred by the same pattern.

A positioning device 50 for positioning the first and second reflective type photomasks 18a and 18b used in the second embodiment will be described hereinafter with reference to FIG. 4.

Figure 4:
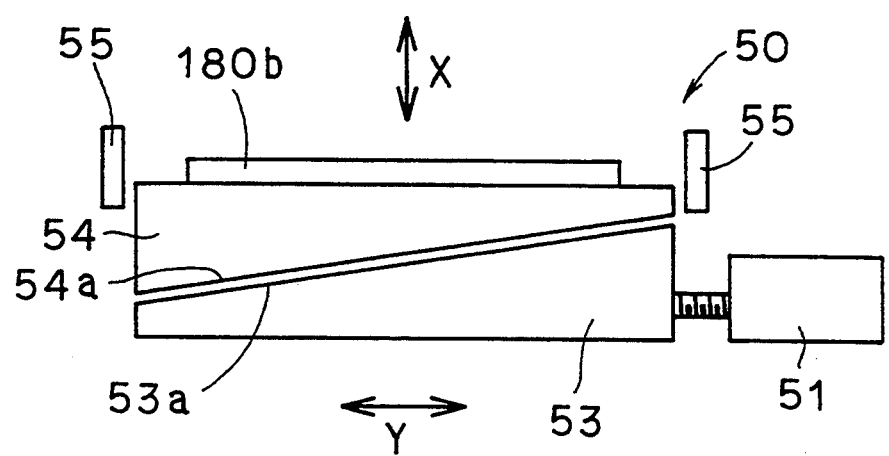
FIG. 4 schematically shows a structure of a positioning apparatus for determining the position of a photomask.

Referring to FIG. 4, a positioning device 50 includes an X stage 54 for fixing a second photomask stage 180b on which a second reflective type photomask 18b is mounted, and movable in the direction indicated by arrow X, a guide 55 for regulating the moving direction of X stage 54, and a Y stage 53 for moving X stage 54. Y stage 53 moves in the direction of arrow Y according to the forward or reverse rotation of a motor 51. Inclining surfaces 53a and 54a formed in a predetermined taper configuration are provided at the abutted planes of Y stage 53 and X stage 54.

A third embodiment will be described hereinafter with reference to FIGS. 5A-5E.

Figure 5A:
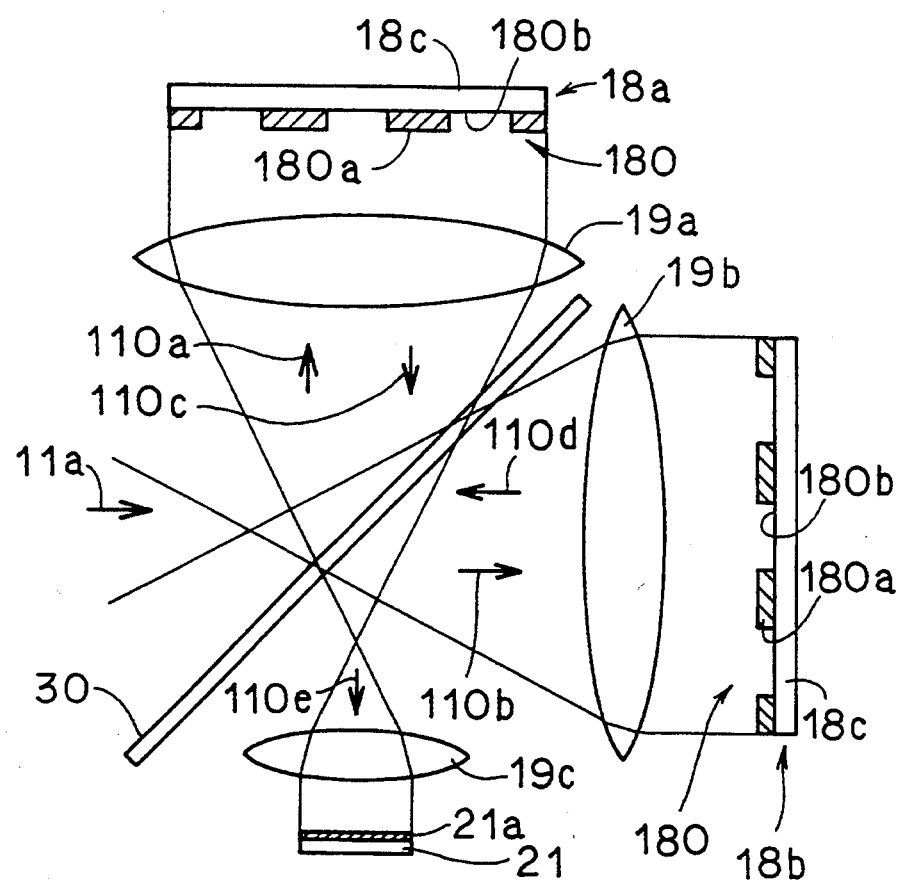
FIG. 5A schematically shows an exposure apparatus according to a third embodiment of the present invention.
Figure 5A:
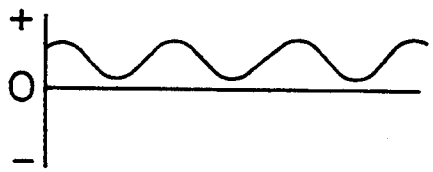
Figure 5A:
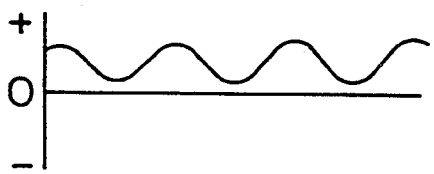
Figure 5A:
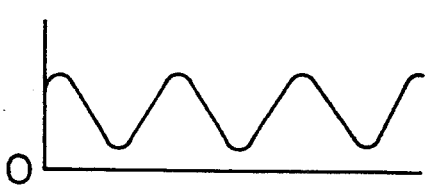
Figure 5E:
FIG. 5E shows a pattern of the resist formed according to the third embodiment.

Referring to FIG. 5A, a first reflective type photomask 18a has a reflecting pattern 180 where a reflecting portion 180a and a transmitting 180b are alternately formed on a quartz mask substrate 18c. Reflecting portion 180a is formed of aluminum or the like.

Second reflective type photomask 18b has a reflecting pattern 180 identical to the pattern of first reflective type photomask 18a formed on quartz mask substrate 18c.

The first light 110a which is light 18a emitted from the light source and reflected by half mirror 30 is directed to first reflective type photomask 18a and reflected therefrom. The first exposure light 110c is formed by this reflected light. The first exposure light 110c on semiconductor wafer 21 has an amplitude shown in FIG. 5B.

The second light 110b passing through half mirror 30 is directed to second reflective type photomask 18b and reflected therefrom. The second exposure light 110d is formed by this reflected light. The second exposure light 110d on semiconductor wafer 21 has an amplitude as shown in FIG. 5C, similar to that of the first exposure light 110c.

Therefore, the third exposure light 110e formed by the merge of the first and second exposure light 110b and 110d by half mirror 30 has light intensity as shown in FIG. 5D.

Therefore, resist film 21a on semiconductor wafer 21 has a pattern which is an inversion of the pattern of the first and second reflective type photomasks 18a and 18b. In comparison with the first embodiment, the present embodiment can have the power loss of light by half mirror 30 restored.

A fourth embodiment will be described hereinafter with reference to FIGS. 6A-E.

Figure 6A:
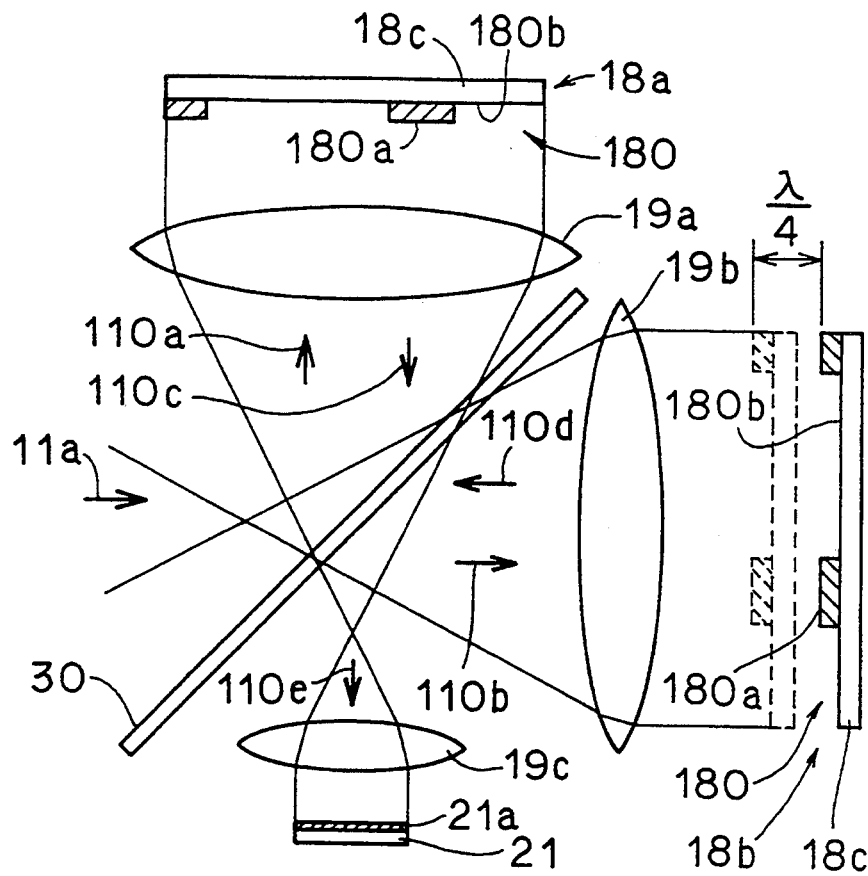
FIG. 6A schematically shows an exposure apparatus according to a fourth embodiment of the present invention.
Figure 6B:
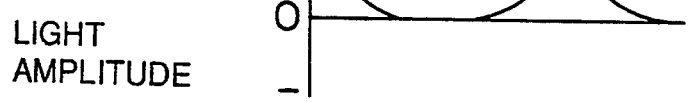
FIG. 6B shows amplitude of the first exposure light on a semiconductor wafer according to the fourth embodiment.
Figure 6C:
FIG. 6C shows amplitude of the second exposure light on a semiconductor wafer according to the fourth embodiment.

Referring to FIG. 6A, a first reflective type photomask 18a has a reflective pattern 180 formed of a reflecting portion 180a and a transmitting portion 180b on a quartz mask substrate 18c. Reflecting portion 180a is formed of aluminum or the like.

On quartz mask substrate 18c, second reflective type photomask 18b has a reflecting pattern 180 formed which is the first reflective type photomask converted by 90°.

Second reflective type photomask 18b is disposed at a position shifted by λ/4 as shown in FIG. 6A to provide a phase difference of λ/2 to the light reflected on second reflective type photomask 18b with respect to the light reflected on first reflective type photomask 18a.

Thus, a light path difference of λ/2 can be provided between light transmitted on the first reflected type photomask 18a and light reflected on the second reflective type photomask 18b.

The first light 110a which is light 11a emitted from the light source and reflected by half mirror 30 is directed to first reflective type photomask 18a and reflected therefrom. The first exposure light 110c is formed by this reflected light. The first exposure light 110c on semiconductor wafer 21 has an amplitude shown in FIG. 6B.

The second light 110b passing through half mirror 30 is directed to second reflective type photomask 18b and reflected therefrom. The second exposure light 110d is formed by this reflected light. The second exposure light 110d on semiconductor wafer 21 has an amplitude shown in FIG. 6C.

Figure 6D:
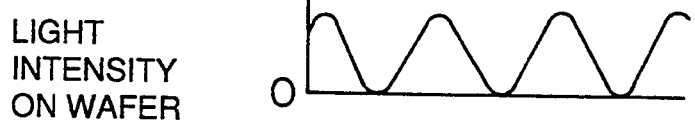
FIG. 6D shows light intensity on a semiconductor wafer when the first exposure light and the second exposure light are merged according to the fourth embodiment.
Figure 6E:
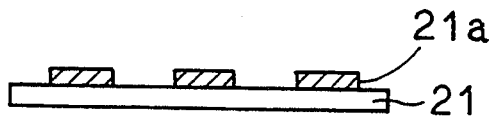
FIG. 6E shows a pattern of the resist formed according to the fourth embodiment.

Therefore, the third exposure light 110e formed by the merge of the first exposure light 110c and the second exposure light 110d by half mirror 30 has light intensity shown in FIG. 6D.

It can be appreciated from the drawing that the light intensity distribution has the bottom edge portion canceled by diffraction, whereby the light intensity becomes definite. Therefore, a sharp image can be transferred to resist film 21a on semiconductor wafer 21. According to the fourth embodiment, a function effect similar to that of a Robinson type in a conventional phase shift method can be obtained.

A fifth embodiment will be described hereinafter with reference to FIGS. 7A-7E.

Figures 7A, 7E:
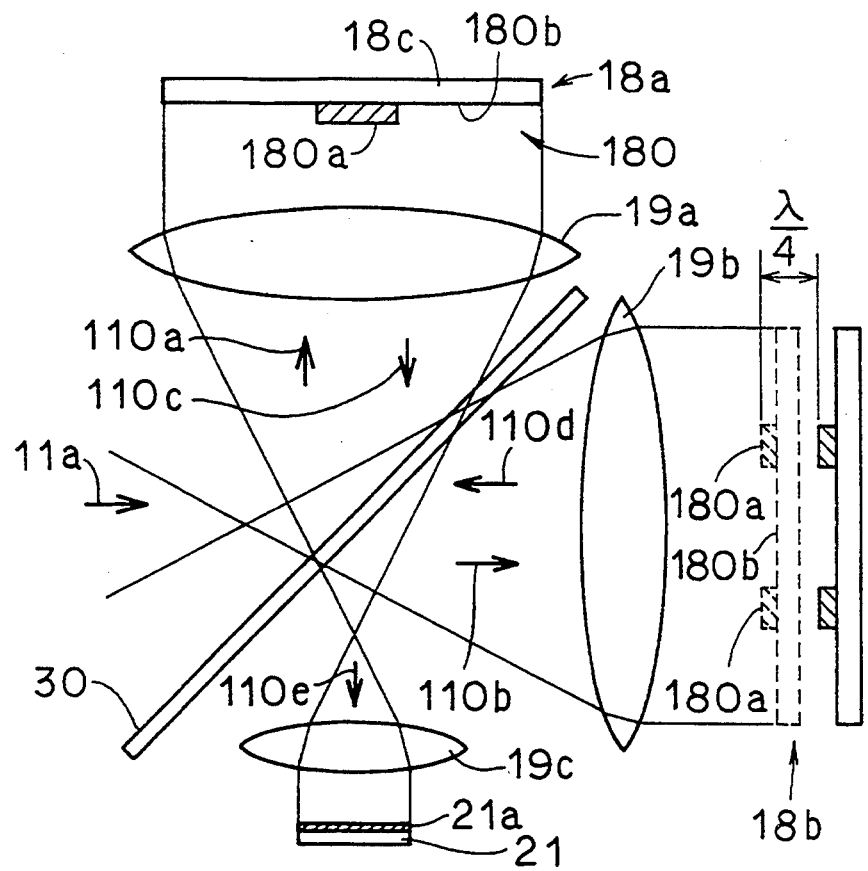
FIG. 7A schematically shows an exposure apparatus according to a fifth embodiment of the present invention.
FIG. 7E shows a pattern of the resist formed according to the fifth embodiment.

Referring to FIG. 7A, a first reflective type photomask 18a has a reflecting portion 180a formed at a predetermined position on a quartz mask substrate 18c. The reflecting portion is formed of aluminum or the like.

On quartz mask substrate 18c of second reflective type photomask 18b, a pair of reflecting portions 180a and 180a are formed at an interval wider than the width of reflecting portion 180a is formed on first reflective type photomask 18c.

Second reflective type photomask 18b is disposed at a position shifted by λ/4 as shown in FIG. 7A to provide a phase difference of λ/2 to the light reflected on the second reflective type photomask 18b with respect to the light reflected on first reflective type photomask 18a.

Thus, a light path difference of λ/2 can be provided between light reflected on the first and second reflective type photomasks 18a and 18b.

The first light 110a which is light 11a emitted from the light source and reflected by half mirror 30 is directed to first reflective type photomask 18a and reflected therefrom. The first exposure light 110c is formed by this reflected light. The first exposure light 110c on semiconductor wafer 21 has an amplitude shown in FIG. 7B with extending edges.

The second light 110b passing through half mirror 30 is directed to second reflective type photomask 18b and reflected therefrom. The second exposure light 110d is formed by this reflected light. The second exposure light 110d on semiconductor wafer 21 has an amplitude shown in FIG. 7C.

The third exposure light 110e formed by the merge of the first and second exposure light 110c and 110d by half mirror 30 results in light intensity as shown in FIG. 7D where the edges of the mountain show 0. Thus, a sharp image can be transferred to resist film 21a on semiconductor wafer 21 as shown in FIG. 7E.

According to the fifth embodiment, a function effect similar to that of the conventional auxiliary shifter type phase shifter method can be obtained.

A sixth embodiment will be described hereinafter with reference to FIGS. 8A-8E.

Figure 8A:
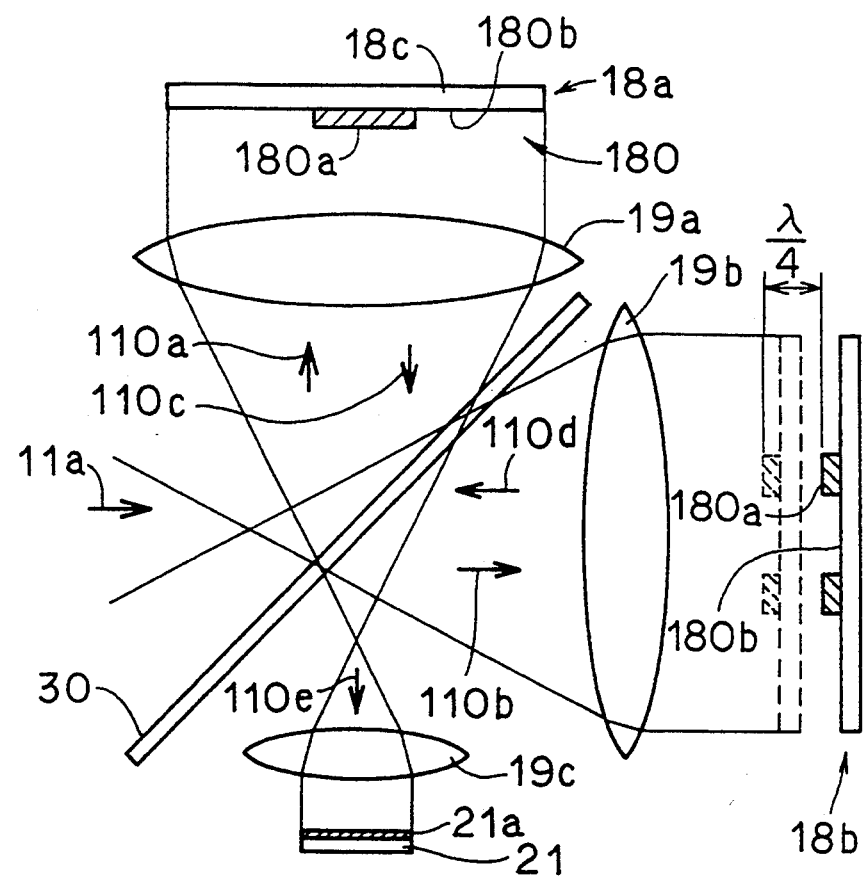
FIG. 8A schematically shows an exposure apparatus according to a sixth embodiment of the present invention.
Figure 8A:
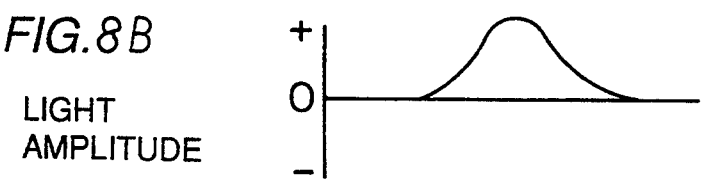
Figure 8A:
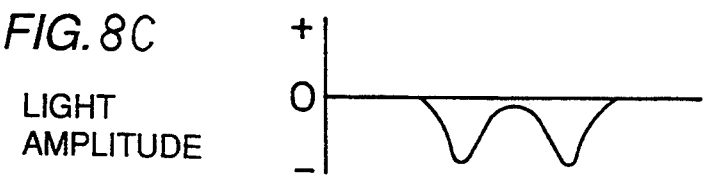
Figure 8A:
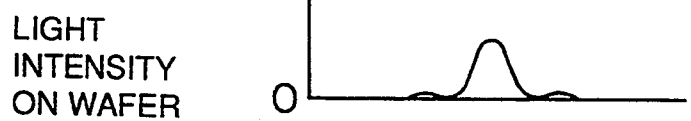

Referring to FIG. 8A, a first reflective type photomask 18a has a reflecting portion 180a formed at a predetermined position on a quartz mask substrate 18c. The reflecting portion is formed of aluminum or the like.

On quartz mask substrate 18c of second reflective type photomask 18b, a pair of reflecting portions 180a having an interval identical to the width of reflective portion 180a on first reflective type photomask 18a is formed.

Second reflective type photomask 18b is disposed at a position shifted by λ/4 as shown in FIG. 8A to provide a phase difference of λ/2 to the light reflected on the second reflective type photomask 18b with respect to the light reflected on first reflective type photomask 18a.

Thus, a light path difference of λ/2 can be provided between light reflected on the first and second reflective type photomasks 18a and 18b.

The first light 110a which is light 11a emitted from light source and reflected by half mirror 30 is directed to first reflective type photomask 18a and reflected therefrom. The first exposure light 110c is formed by this reflected light. The first exposure light 110c on semiconductor wafer 21 has an amplitude as shown in FIG. 8B where both edges extend.

The second light 110b passing through half mirror 30 is directed to second reflective type photomask 18b and reflected therefrom. The second exposure light 110d is formed by this reflected light. The second exposure light 110d on semiconductor wafer 21 has an amplitude shown in FIG. 8C.

The third exposure light 110e formed by the merge of the first and second exposure light 110c and 110d by half mirror 30 has a light intensity shown in FIG. 8D.

Figure 8E:
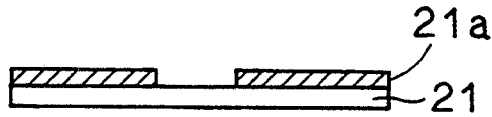
FIG. 8E shows a pattern of the resist formed according to the sixth embodiment.

Although the maximum intensity of light is reduced, a mountain with edges indicating light intensity of 0 is appreciated. Therefore, a sharp image can be transferred to resist film 21a on semiconductor wafer 21 as shown in FIG. 8E. According to the sixth embodiment, an effect similar to that of a conventional self-alignment type phase shift method can be obtained.

A seventh embodiment will be described hereinafter with reference to FIG. 9A–9E.

Figure 9A:
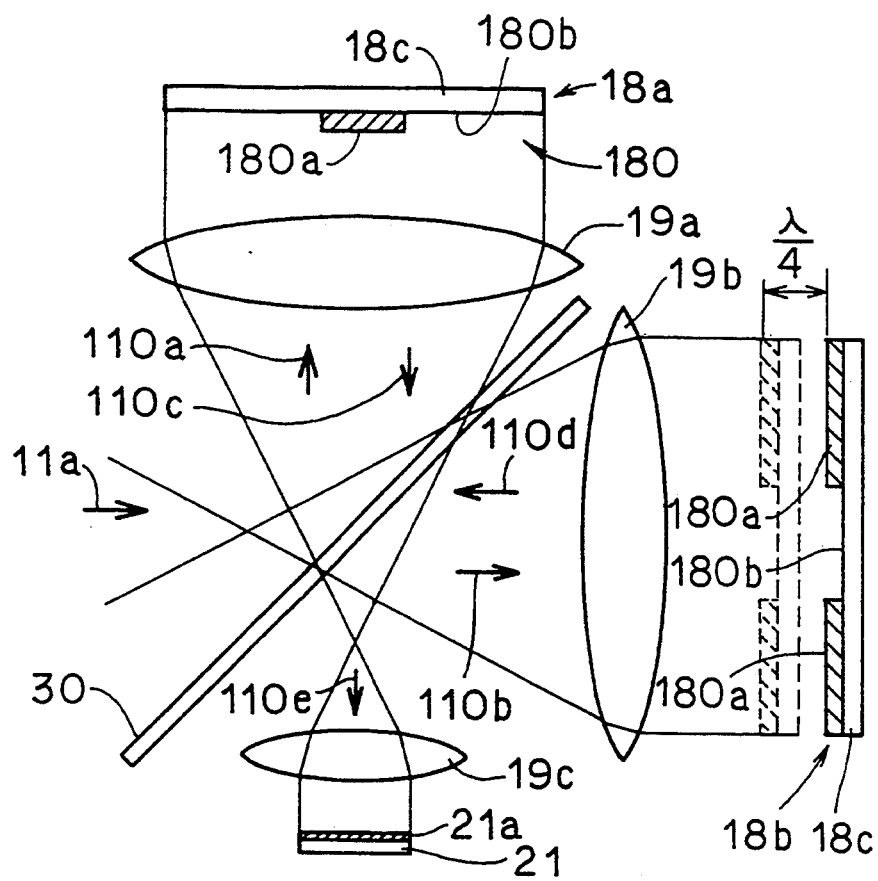
FIG. 9A schematically shows an exposure apparatus according to a seventh embodiment of the present invention.

Referring to FIG. 9A, a first reflective type photomask 18a has a reflecting portion 180a formed at a predetermined position on a quartz mask substrate 18c. Reflecting portion 180a is formed of aluminum or the like.

On quartz mask substrate 18c of second reflective type photomask 180b, a transmitting portion 180b substantially identical to reflecting portion 180a in width is provided at a position corresponding to reflecting portion 180a on first reflective type photomask 18a, and a reflecting portion 180a of a predetermined reflectance is formed to sandwich transmitting portion 180d.

Reflecting portion 180a of the present embodiment is formed of a reflecting material (an aluminum material applied with a chrominium anti-reflective film, for example) that reflects only approximately 10% of the directed second light 110b.

As shown FIG. 9A second reflective photomask 18b is disposed at a position shifted by λ/4 to provide a phase difference of λ/2 to the light reflected on the second reflective type photomask 18b with respect to the light reflected on first reflective type photomask 18a. Thus, a light path difference of λ/2 can be provided between light reflected on the first and second reflective type photomasks 18a and 18b.

Figure 9B:
FIG. 9B shows amplitude of the first exposure light on a semiconductor wafer according to the seventh embodiment.
Figure 9C:
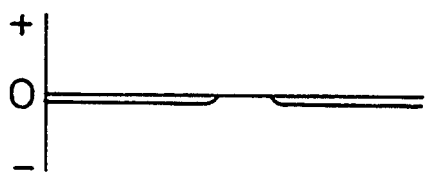
FIG. 9C shows light amplitude of the second exposure light on a semiconductor wafer according to the seventh embodiment.

The first light 110a which is light 11a emitted from the light source and reflected by half mirror 30 is directed to first reflective type photomask 18a and reflected therefrom. The first exposure light 110c is formed by this reflected light. The first exposure 110c on semiconductor wafer 21 has a mountain-like amplitude with the fringe edges extending as shown in FIG. 9B.

The second light 110b passing through half mirror 30 is directed to second reflective type photomask 18b and reflected therefrom. The second exposure light 110d is formed by this reflected light. The second exposure light 110d on semiconductor wafer 21 has an amplitude shown in FIG. 9C.

Figure 9D:
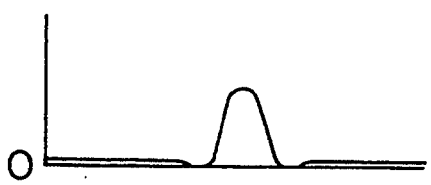
FIG. 9D shows light intensity on a semiconductor wafer when the first exposure light and the second exposure light are merged according to the seventh embodiment.

The third exposure light 110e formed by the merge of the first and second exposure light 110c and 110d by half mirror 30 has light intensity shown in FIG. 9D.

Figure 9E:
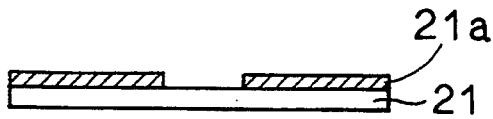
FIG. 9E shows a pattern of the resist formed according to the seventh embodiment.

Although the entire surface of the semiconductor wafer is irradiated, the light intensity distribution shows a sharp mountain with the bottom edges of 0 in light intensity in which an sharpness due to diffraction is substantially canceled. Therefore, a sharp image can be transferred to resist film 21a as shown in FIG. 9E.

According to the seventh embodiment, a function effect identical to a conventional halftone phase shift method can be obtained.

An eighth embodiment of the present invention will be described hereinafter with reference to FIGS. 10A–10E.

Figure 10A:
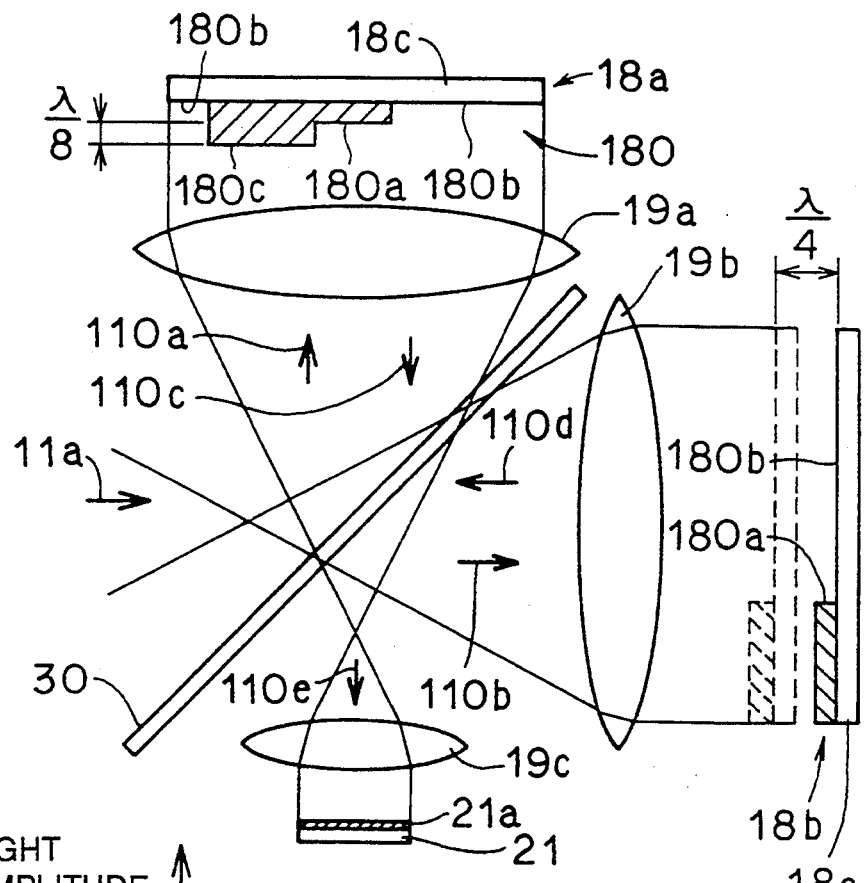
FIG. 10A schematically shows an exposure apparatus according to an eighth embodiment of the present invention.

Referring to FIG. 10A, a first reflective type photomask 18a has a first reflecting portion 180a and a second reflecting portion 180c formed on a quartz mask substrate 18c with a light transmitting portion 180b at both sides thereof. First and second reflecting portions 180a and 180c are formed of aluminum or the like.

As shown in FIG. 10A, a stepped portion of λ/8 is provided for the purpose of obtaining a phase difference of λ/4 to the light reflected on first reflecting portion 180a with respect to the light reflected on second reflecting portion 180c.

On quartz mask substrate 18c of second reflective type photomask 18b, a reflecting portions 180a is formed at a position substantially corresponding to the second stepped portion 180c of first reflective type photomask 18a. This reflecting portion 180a is formed of aluminum or the like.

As shown in FIG. 10A, second reflective type photomask 18b is disposed at a position shifted by λ/4 to provide a phase difference of λ/2 to the light reflected on the second reflective type photomask 18b with respect to the light reflected on the second reflecting portion 180c of first reflective type photomask 18a.

Thus, a light path difference of λ/2 can be provided between light reflected on the first reflective type photomasks 18a and light reflected on the second reflective type photomask 18b.

Figure 10B:
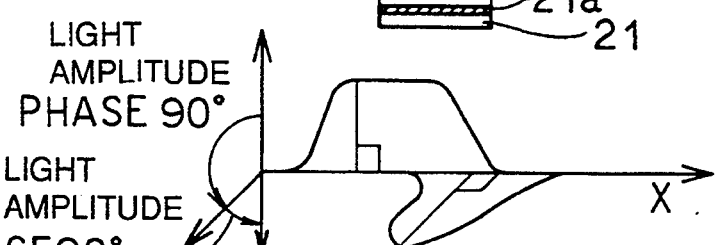
FIG. 10B shows amplitude of the first exposure light on a semiconductor wafer according to the eighth embodiment.

The first light 110a which is light 11a emitted from the light source and reflected by half mirror 30 is directed to first reflective type photomask 18a and reflected therefrom. The first exposure light 110c is formed by this reflected light. The first exposure light 110c on semiconductor wafer 21 has an amplitude as shown in FIG. 10B.

Figure 10C:
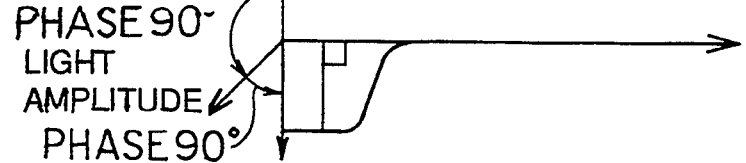
FIG. 10C shows amplitude of the second exposure light on a semiconductor wafer according to the eighth embodiment.

The second light 110b passing through half mirror 30 is directed to second reflective type photomask 18b and reflected therefrom. The second exposure light 110d is formed by this reflected light. The second exposure light 110d on semiconductor wafer 21 has an amplitude as shown in FIG. 10C.

Figure 10D:
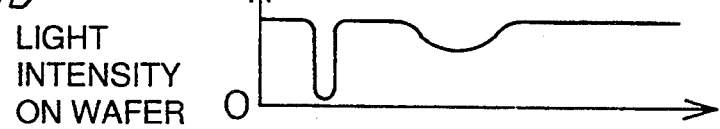
FIG. 10D shows light intensity on a semiconductor wafer when the first exposure light and the second exposure light are merged according to the eighth embodiment.

The third exposure light 110e formed by the merge of the first exposure light 110c and the second exposure light 110d by half mirror 30 has light intensity on semiconductor wafer 21 as shown in FIG. 10D.

Figure 10E:
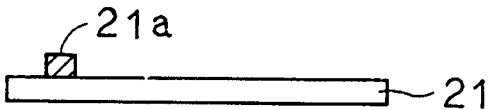
FIG. 10E shows a pattern of the resist formed according to the eighth embodiment.

Therefore, an image can be transferred to resist film 21a on semiconductor wafer 21 as shown in FIG. 10E. According to the eighth embodiment, a function effect similar to that of a conventional multi-step type phase shifter mask can be obtained.

A ninth embodiment will be described hereinafter with reference to FIGS. 11A–11E.

Figure 11A:
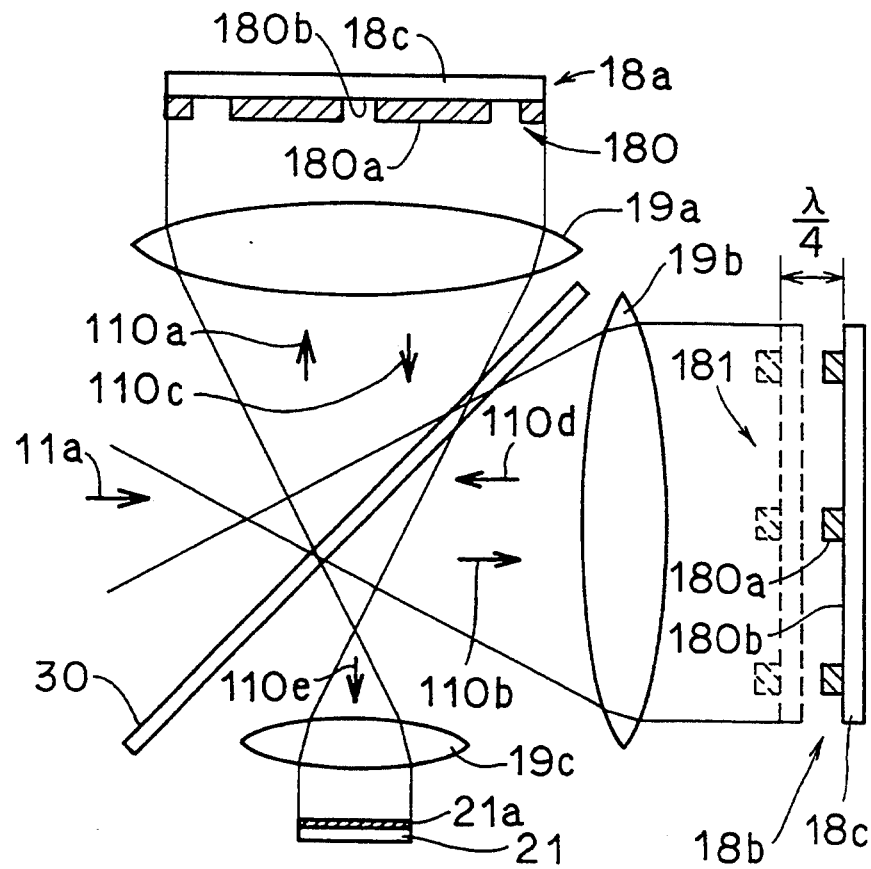
FIG. 11A schematically shows an exposure apparatus according to a ninth embodiment of the present invention.
Figure 11A:
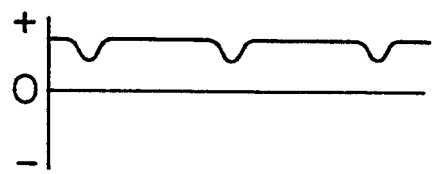
Figure 11A:
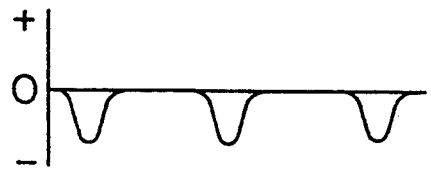
Figure 11A:
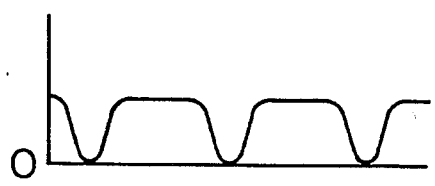

Referring to FIG. 11A, a first reflective type photomask 18a has a reflective pattern 180 formed of a predetermined configuration including a reflecting portion 180a and a transmitting portion 180b on a quartz mask substrate 18c. Reflecting portion 180a is formed of aluminum or the like.

On quartz mask substrate 18c of second reflective type photomask 18b, a reflecting pattern 181 of a reflecting portion 28a and a transmitting portion 180b are formed, having an inverted pattern of reflective pattern 180 of first reflective type photomask 18a.

As shown in FIG. 11A, second reflective type photomask 18b is disposed at a position shifted by λ/4 to provide a phase difference of λ/2 to the light reflected on the second reflective type photomask 18b with respect to the light reflected on the first reflective type photomask 18a. Thus, a light path difference of λ/2 can be provided between the light reflected on first reflective type photomask 18a and light reflected on second reflective type photomask 18b.

The first light 110a which is light 11a emitted from the light source and reflected by half mirror 30 is directed to first reflective type photomask 18 and reflected therefrom. The first exposure light 110c is formed by this reflected light. The first exposure light 110c on semiconductor wafer 21 has a light amplitude as shown in FIG. 11B.

The second light 110b passing through half mirror 30 is directed to second reflective type photomask 18b and reflected therefrom. The second exposure light 110d is formed by this reflected light. The second exposure light 110d on semiconductor wafer 21 has an amplitude as shown in FIG. 11C.

Therefore, the third exposure light 110e formed by the merge of the first exposure light 110c and the second exposure light 110d by half mirrors 30 on semiconductor wafer 21 results in light intensity as shown in FIG. 11D.

Figure 11E:
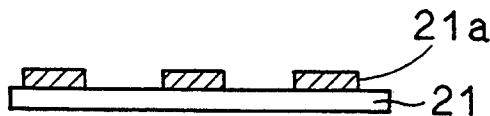
FIG. 11E shows a pattern of the resist formed according to the ninth embodiment.

Because the light intensity difference is sharp, a sharp image can be transferred to resist film 21a on semiconductor wafer 21, as shown in FIG. 11E. According to this ninth embodiment, an effect similar to that of a conventional shifter light shielding type I phase shift method can be obtained.

A tenth embodiment of the present invention will be described hereinafter with reference to FIGS. 12A–12E.

Referring to FIG. 12A, a first reflective type photomask 18a has a reflective pattern 180 formed on a quartz mask substrate 18c including a transmitting portion 180b at a predetermined position and a reflecting portion 180a at both ends thereof. The reflective portion 180a is formed of aluminum or the like.

On quartz mask substrate 18c of second reflective type photomask 18b, a reflective pattern 181 including a reflecting portion 180a and a transmitting portion 180b which is inversion of reflective pattern 180 of first reflective type photomask 18a are formed.

As shown in FIG. 12A, second reflective type photomask 18b is disposed at a position shifted by λ/4 to provide a phase difference of λ/2 to the light reflected on second reflective type photomask 18b with respect to the light reflected on first reflective photomask 18a. Therefore, a light path difference of λ/2 can be provided between light transmitted on the first and second reflective type photomasks 18a and 18b.

The first light 110a which is light 11a emitted from the light source and reflected by half mirror 30 is directed to first reflective type photomask 18a to be reflected therefrom. The first exposure light 110c is formed by this reflected light. The first exposure light 110c on semiconductor wafer 21 has an amplitude as shown in FIG. 12B.

The second light 110b going through half mirror 30 is directed to second reflective type photomask 18b and reflected therefrom. The second exposure light 110d is formed by this reflected light. The second exposure light 110d on semiconductor wafer 21 has an amplitude as shown in FIG. 12C.

The third exposure light 110e formed by the merge of the first exposure light 110c and the second exposure light 110d by half mirror 30 has light intensity as shown in FIG. 12D.

Because the light intensity difference is sharp, a sharp image can be transferred to resist film 21a on semiconductor wafer 21, as shown in FIG. 12E.

According to the tenth embodiment, an effect similar to that of a conventional phase shift method of shifter light shielding type II can be obtained.

An eleventh embodiment of the present invention will be described hereinafter with reference to FIGS. 13A–13E.

Figure 13A:
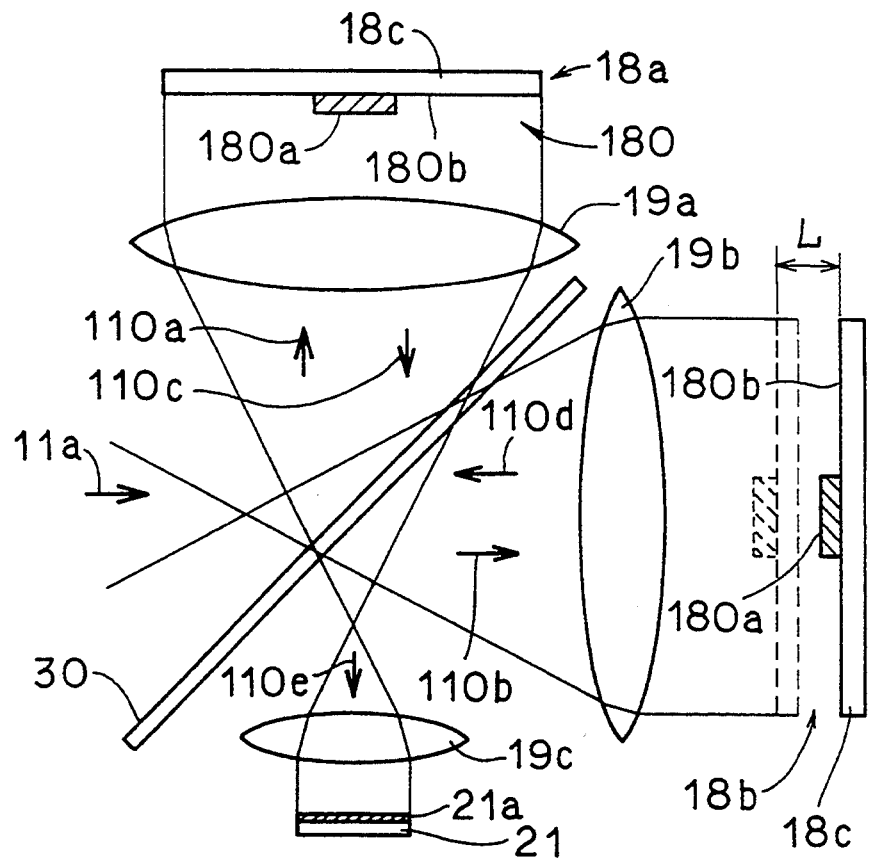
FIG. 13A schematically shows an exposure apparatus according to a eleventh embodiment of the present invention.

Referring to FIG. 13A, a first reflective type photomask 18a has a reflecting portion 180a formed at a predetermined position on a quartz mask substrate 18c. This reflecting portion 180a is formed of aluminum or the like.

On quartz mask substrate 18c of second reflective type photomask 18b, a reflecting portion 180a at a position corresponding to reflecting portion 180a of first reflective type photomask 18a is formed. Reflective portion 180a is formed of aluminum or the like.

As shown in FIG. 13A, second reflective type photomask 18b is disposed at a position shifted by distance L so that it has a focusing position different from that of the first reflective type photomask 18a on semiconductor substrate 21.

Figure 13B:
FIG. 13B shows amplitude of the first exposure light on a semiconductor wafer according to the eleventh embodiment.

The first light 110a which is light 11a emitted from the light source and reflected by half mirror 30 is directed to first reflective type photomask 18a and reflected therefrom. The first exposure light 110c is formed by this reflected light. The first exposure light 110c on semiconductor wafer 21 has an amplitude as shown in FIG. 13B.

Figure 13C:
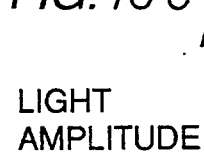
FIG. 13C shows amplitude of the second exposure light on a semiconductor wafer according to the eleventh embodiment.

The second light 110b passing through half mirror 30 is directed to second reflective type photomask 18b and reflected therefrom. The second exposure light 110d is formed by this reflected light. The second exposure light 110d on semiconductor wafer 21 has an amplitude as shown in FIG. 13C.

Figure 13D:
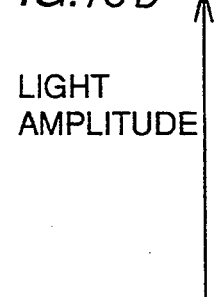
FIG. 13D shows light intensity on a semiconductor wafer when the first exposure light and the second exposure light are merged according to the eleventh embodiment.

The third exposure light 110e formed by the merge of the first and second exposure light 110c and 110d by half mirror 30 has an intensity as shown in FIG. 13D.

As described above, the third exposure light 110e merged from first and second exposure light 110c and 110d has a longer focus width because the focusing position differs between the first and second exposure light 110c and 110d.

Figure 13E:
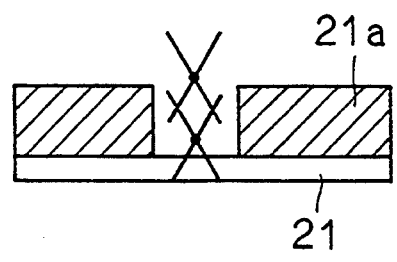
FIG. 13E shows a pattern of the resist formed according to the eleventh embodiment.

Even when resist film 21a is formed in great thickness on semiconductor wafer 21, it is possible to transfer an image having a uniform width even as a function of depth as shown in FIG. 13E.

A twelfth embodiment of the present invention will be described hereinafter with reference to FIGS. 14A–14E.

Figure 14A:
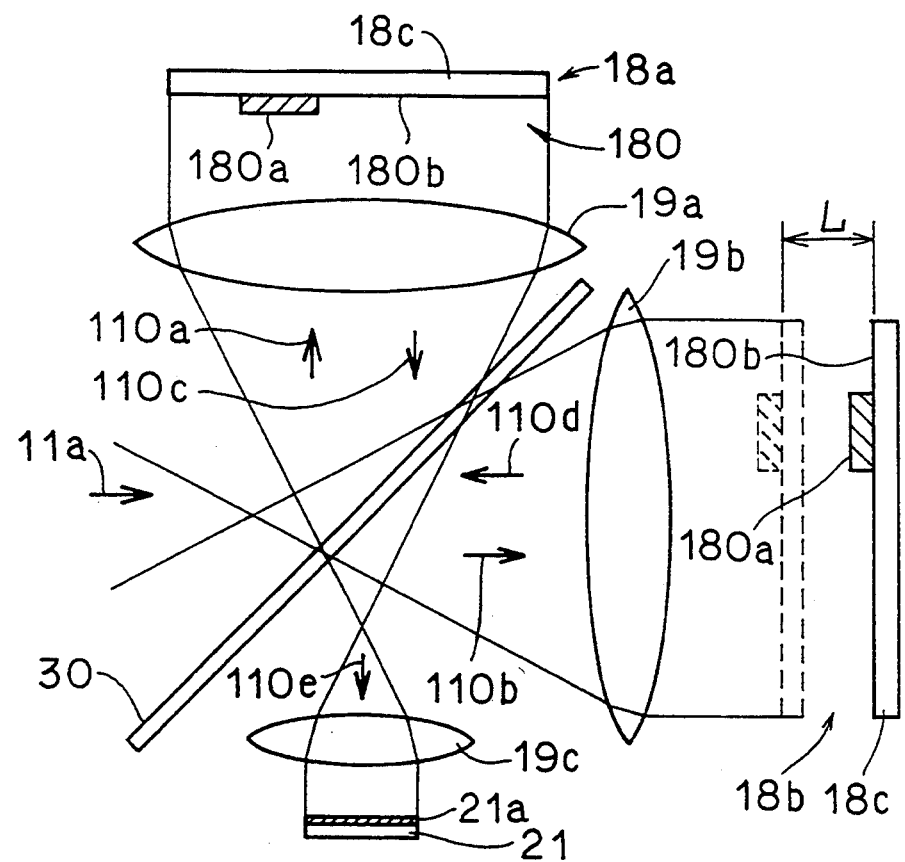
FIG. 14A schematically shows an exposure apparatus according to a twelfth embodiment of the present invention.

Referring to FIG. 14A, a first reflective type photomask 18a has a reflecting portion 180a of a predetermined configuration formed on a quartz mask substrate 18c. The reflecting portion 180a is formed of aluminum or the like.

On quartz mask substrate 18c of second reflective type photomask 18b, a reflecting portion 180a is formed at a position different from that of reflecting portion 180a of first reflective type photomask 18a is formed.

Similar to the above-described 13th embodiment, second photomask 18b is disposed at a position shifted by a distance of L to change the focusing position on semiconductor substrate 21.

Figure 14B:
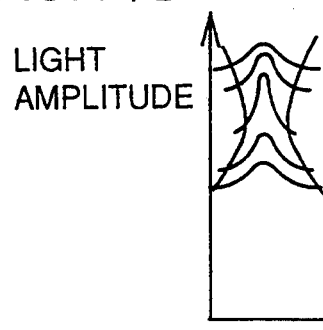
FIG. 14B shows amplitude of the first exposure light on a semiconductor wafer according to the twelfth embodiment.

The first light 110a which is light 11a emitted from the light source and reflected by half mirror 30 is directed to first reflective type photomask 18a and reflected therefrom. The first exposure light 110c is formed by this reflected light. The first exposure light 110c on semiconductor wafer 21 has an amplitude as shown in FIG. 14B.

Figure 14C:
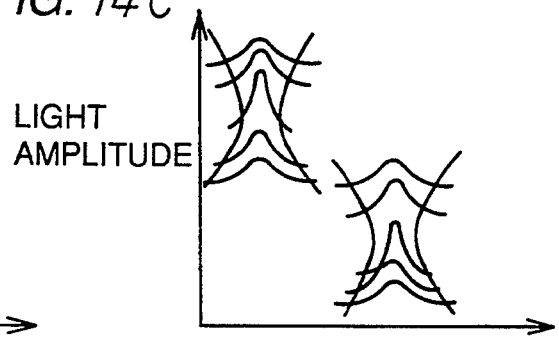
FIG. 14C shows amplitude of the second exposure light on a semiconductor wafer according to the twelfth embodiment.

The second light 110b transmitted through half mirror 30 is directed to second reflective type photomask 18b and reflected therefrom. The second exposure light 110d is formed by this reflected light. The second exposure light 110d on semiconductor wafer 21 has an amplitude as shown in FIG. 14C.

Figure 14D:
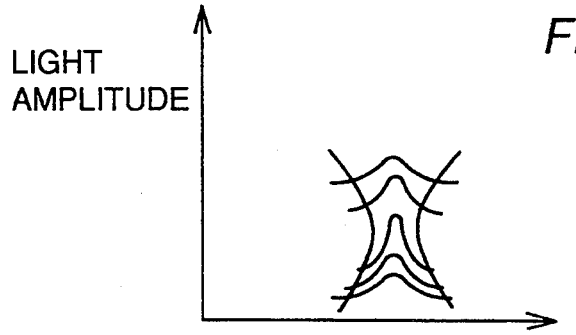
FIG. 14D shows light intensity on a semiconductor wafer when the first exposure light and the second exposure light are merged according to the twelfth embodiment.

The third exposure light 110e formed by the merge of the first and second exposure light 110c and 110d by half mirror 30 have light intensity as shown in FIG. 14D.

Figure 14E:
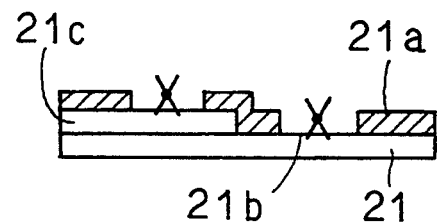
FIG. 14E shows a pattern of the resist formed according to the twelfth embodiment.

Because a predetermined step portion is formed on semiconductor wafer 21 as shown in FIG. 14E, the focusing position differs in a lower face portion 21b and a higher face portion 21c.

Because the second reflective type photomask 18b is disposed such that the focusing position differs, exposure can be carried out simultaneously in respective in-focus states in a semiconductor wafer 21 having a stepped portion as shown in FIG. 14E.

A thirteenth embodiment of the present invention will be described hereinafter with reference to FIGS. 15A–15E.

Figure 15A:
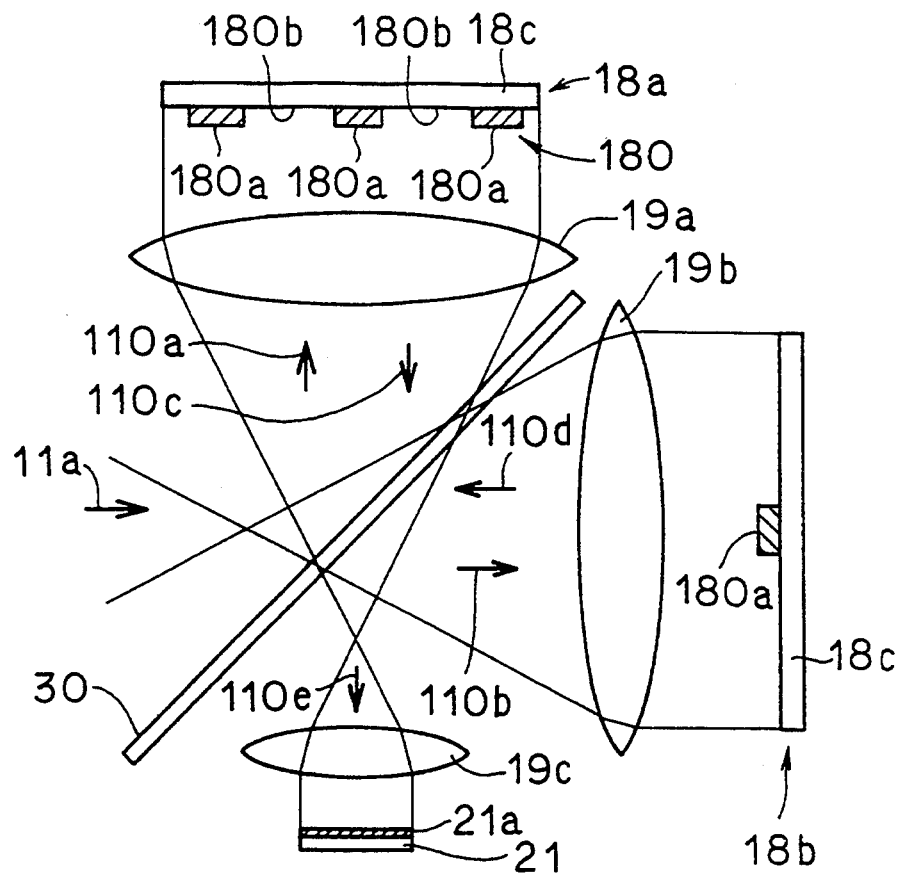
FIG. 15A schematically shows an exposure apparatus according to a thirteenth embodiment of the present invention.

Referring to FIG. 15A, a first reflective type photomask 18a has a reflective pattern 180 formed on a quartz mask substrate 18c including a reflecting portion 180a and a transmitting portion 180b alternately. Reflecting portion 180b is formed of aluminum or the like.

A reflecting portion 180a is formed on quartz mask substrate 18c of the second reflective type photomask 18b at a position corresponding to any of the reflecting portion 180a on first reflective type photomask 18a.

Figure 15B:
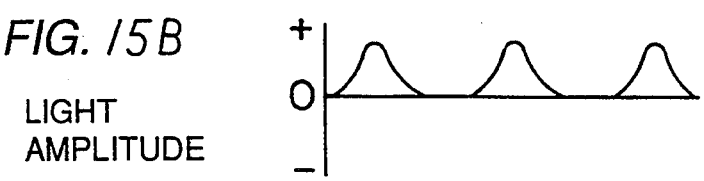
FIG. 15B shows amplitude of the first exposure light on a semiconductor wafer according to the thirteenth embodiment.

The first light 110a which is light 11a emitted from the light source and reflected by half mirror 30 is directed to first reflective type photomask 18a and reflected therefrom. The first exposure light 110c is formed by the reflected light. The first exposure light 110c on semiconductor wafer 21 has an amplitude as shown in FIG. 15B.

Figure 15C:
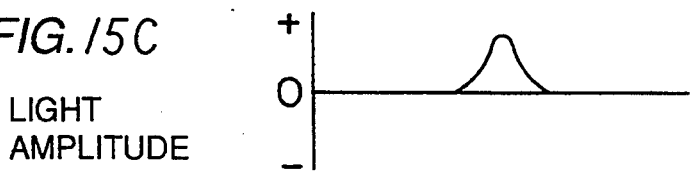
FIG. 15C shows amplitude of the second exposure light on a semiconductor wafer according to the thirteenth embodiment.

The second light 110b transmitted through half mirror 30 is directed to second reflective type photomask 18b and reflected therefrom. The second exposure light 110d is formed by this reflected light. The second exposure light 110d on semiconductor wafer 21 has an amplitude as shown in FIG. 15C.

Figure 15D:
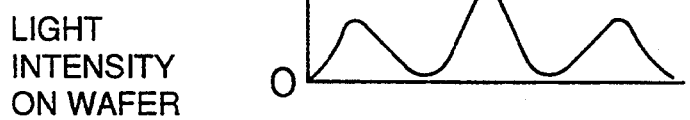
FIG. 15D shows light intensity on a semiconductor wafer when the first exposure light and the second exposure light are merged according to the thirteenth embodiment.

The third exposure light 110e formed by the merge of the first and second exposure light 110c and 110d by half mirror 30 has a light intensity as shown in FIG. 15D.

Figure 15E:
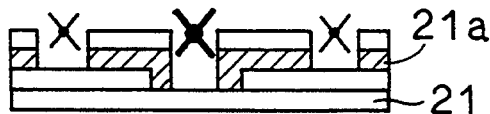
FIG. 15E shows a pattern of the resist formed according to the thirteenth embodiment.

The semiconductor wafer 21 of the present embodiment has a deep stepped portion at a region corresponding to where the first exposure light 110c and the second exposure light 110d overlap to increase light intensity, as shown in FIG. 15E.

A greater exposure amount is directed to form a deep hole. Because exposure is carried out so that the exposure amount is greater in this portion, image transfer to a resist film 21a differing in the exposure amount can be carried out by one exposure process.

Although the exposure apparatus shown in the first-thirteenth embodiments is described using a reflective type photomask, a projection type photomask can also be used.

A structure of an exposure apparatus using a projection type photomask will be described hereinafter.

Figure 16:
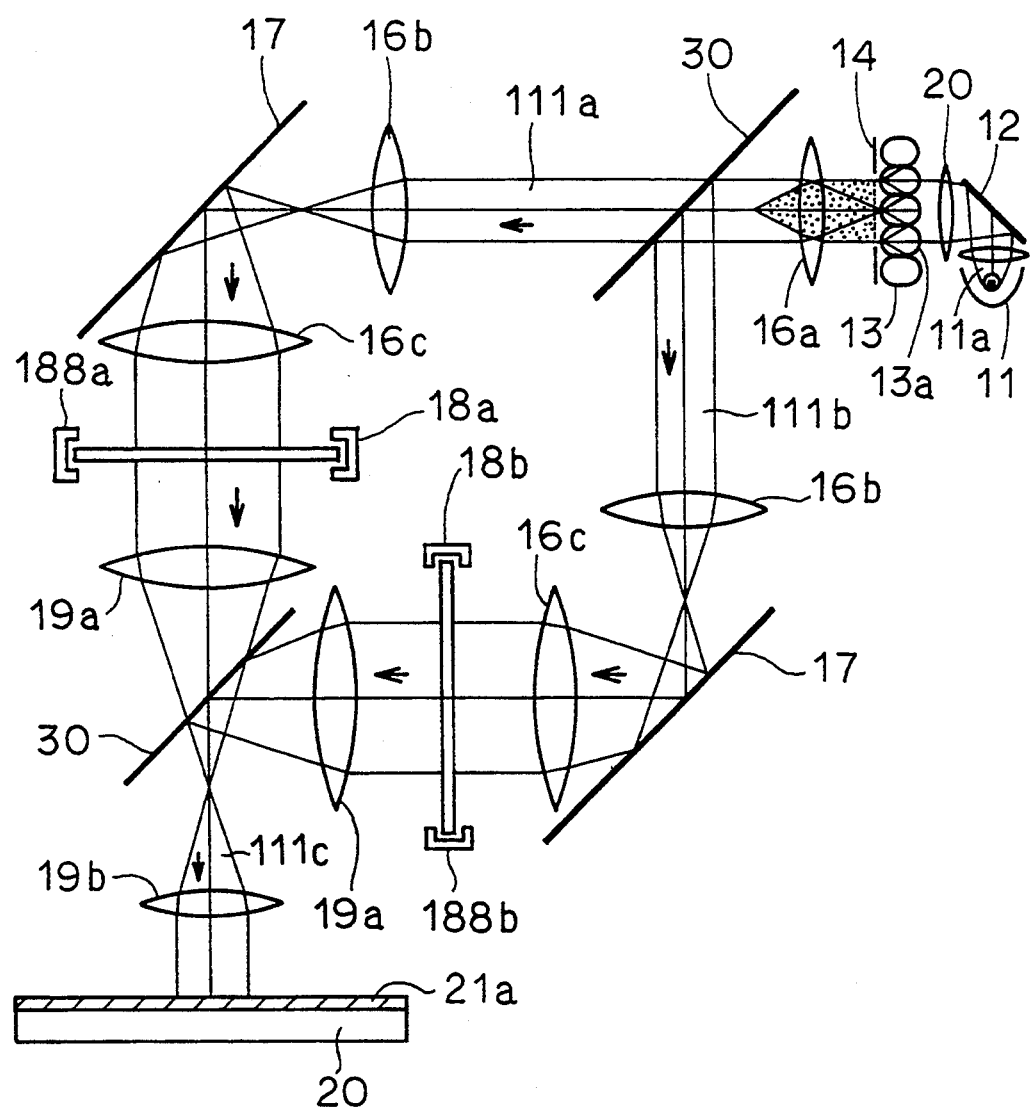
FIG. 16 schematically shows a structure of an exposure apparatus using a transmittive type photomask according to the present invention.
Figure 17:
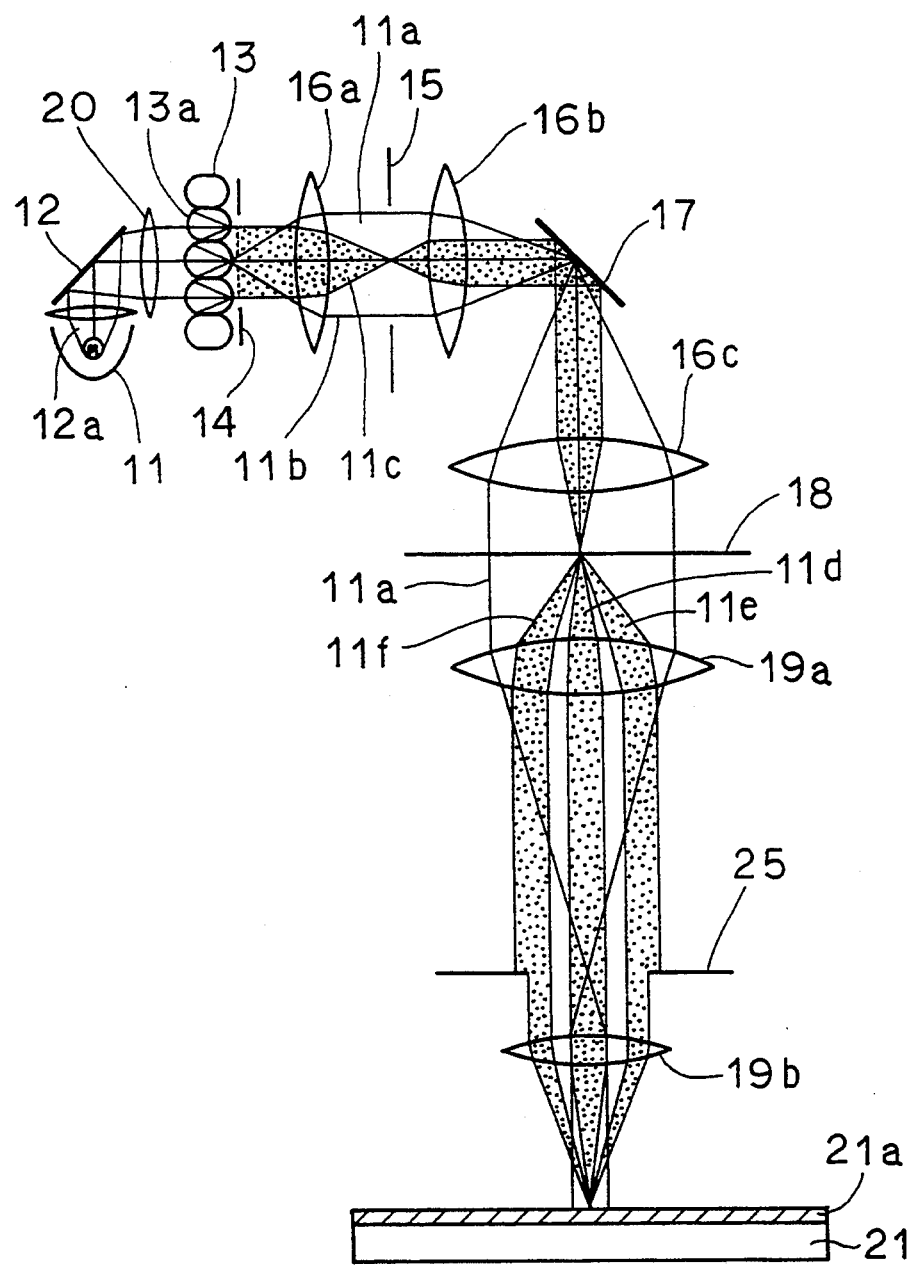
FIG. 17 schematically shows a structure of an exposure apparatus according to conventional art.
Figure 18A:
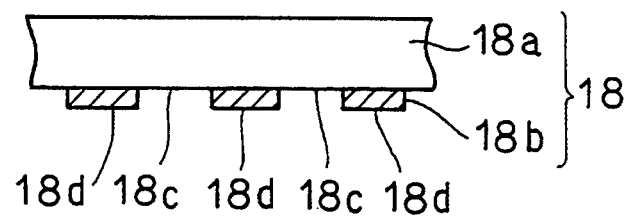
FIG. 18A is a sectional view of a structure of a conventional photomask.
Figure 18B:
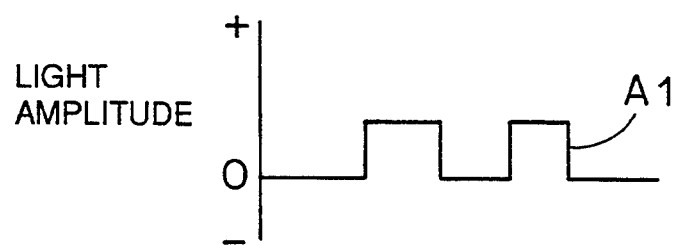
FIG. 18B shows amplitude of light right after going through the photomask of FIG. 18A.
Figure 18C:
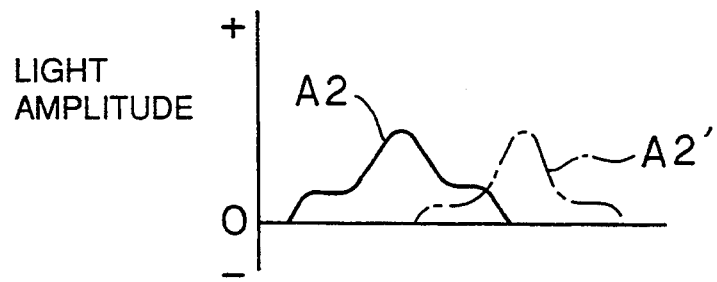
FIG. 18C is a graph showing amplitude of light on a semiconductor wafer when the photomask of FIG. 18A is used.
Figure 18D:
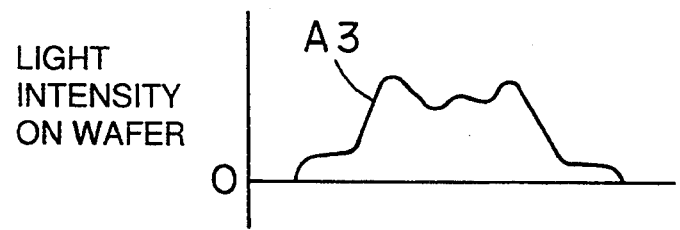
FIG. 18D is a graph merging the graph shown in FIG. 18C.
Figure 19A:
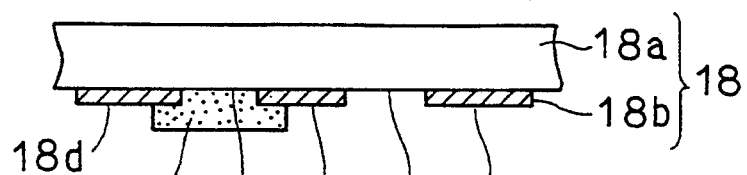
FIG. 19A shows a structure of a photomask supplied with a phase shifter.
Figure 19B:
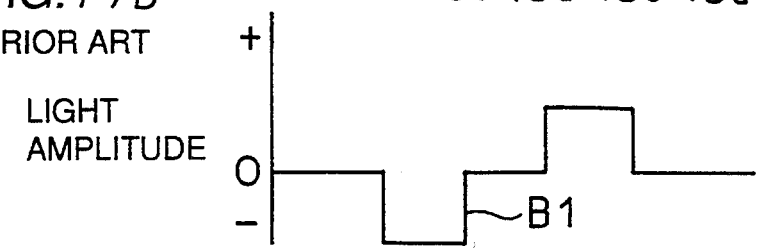
FIG. 19B shows the phase of light passing through the photomask of FIG. 19A.
Figure 19C:
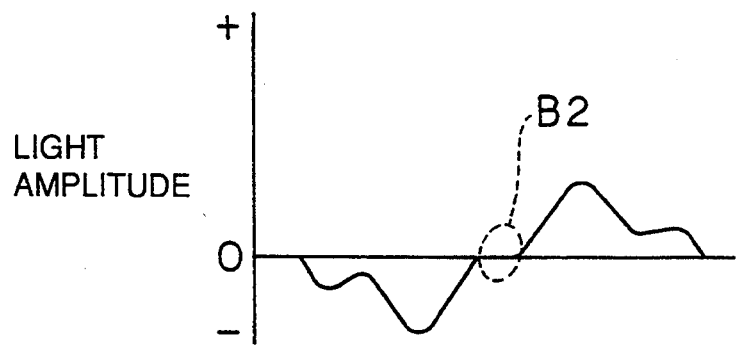
FIG. 19C shows amplitude of light on a semiconductor wafer where light has passed through the photomask of FIG. 19A.
Figure 19D:
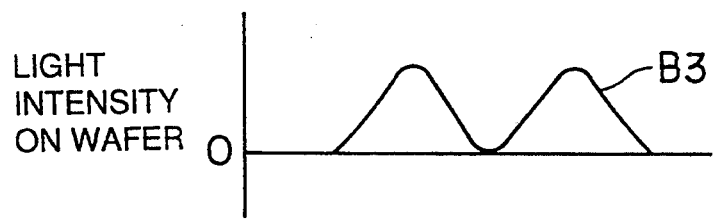
FIG. 19D shows the phase of light of FIG. 19C converted into light intensity.
Figure 20A:
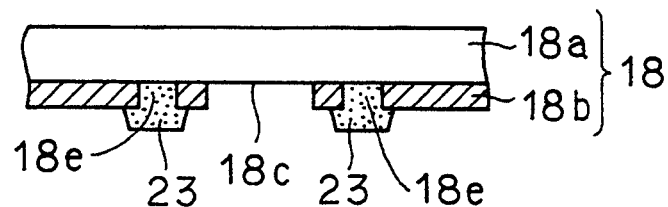
FIG. 20A is a sectional view of a photomask according to a first conventional art.
Figure 20B:
FIG. 20B shows amplitude of light passing through the light transmitting portion of the photomask of FIG. 20A.
Figure 20C:
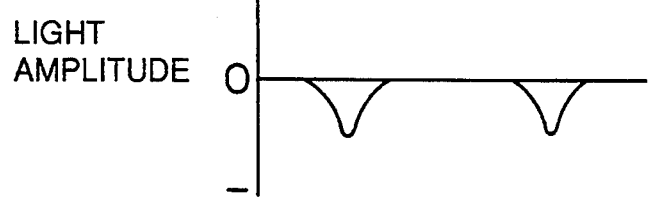
FIG. 20C shows amplitude of light passing through the phase shifter portion of the photomask of FIG. 20A.
Figure 20D:
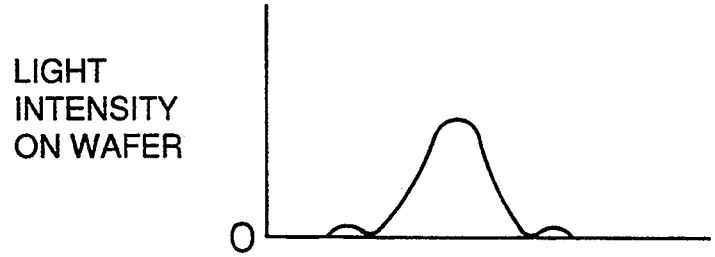
FIG. 20D shows light intensity on a semiconductor wafer in the case where the light shown in FIGS. 20B and 20C are merged.
Figure 20E:
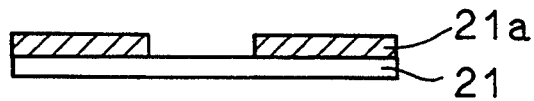
FIG. 20E shows the resist pattern formed by the photomask of FIG. 20A.
Figure 21A:
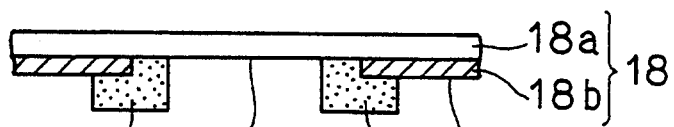
FIG. 21A is a sectional view of a photomask according to a second conventional art.
Figure 21B:
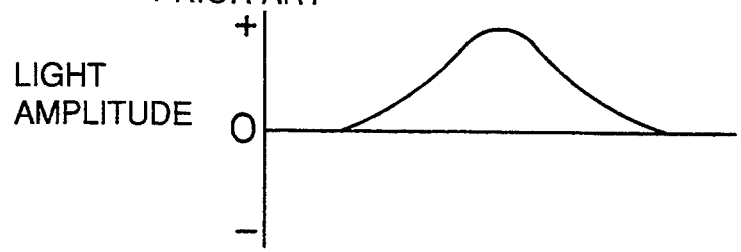
FIG. 21B shows amplitude of light passing through the light transmitting portion of the photomask of FIG. 21A.
Figure 21C:
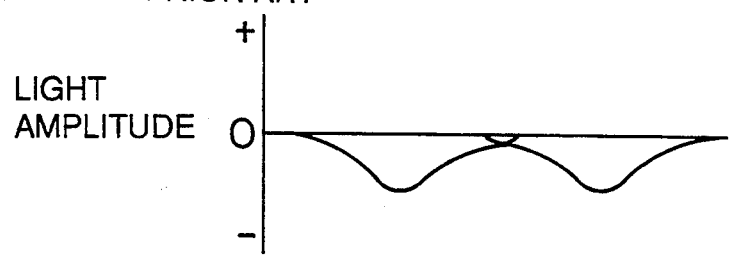
FIG. 21C shows amplitude of light passing through the phase shifter portion of the photomask of FIG. 21A.
Figure 21D:
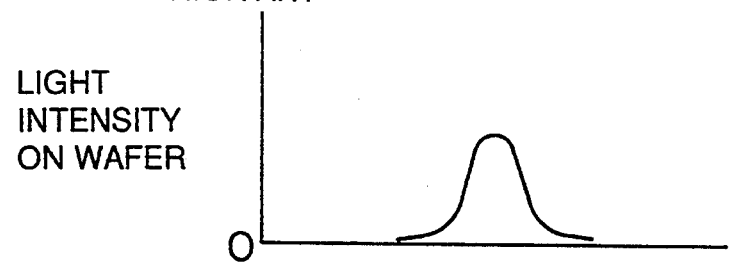
FIG. 21D shows light intensity on a semiconductor wafer in the case where the light shown in FIGS. 21B and 21C are merged.
Figure 21E:
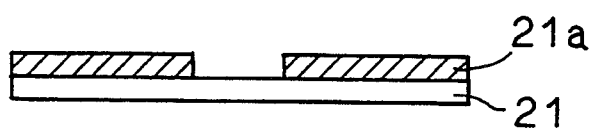
FIG. 21E shows the resist pattern formed by the photomask of FIG. 21A.
Figure 22A:
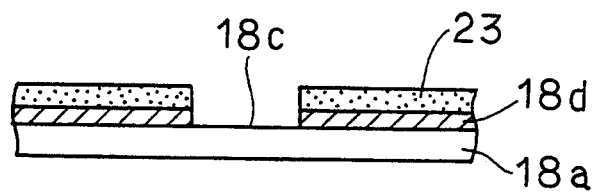
FIG. 22A is a sectional view of a photomask according to a third conventional art.
Figure 22B:
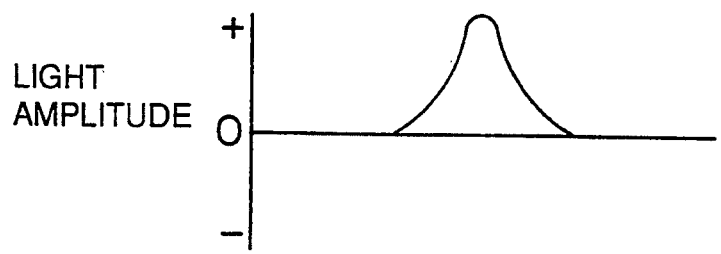
FIG. 22B shows amplitude of light passing through the light transmitting portion of the photomask of FIG. 22A.
Figure 22C:
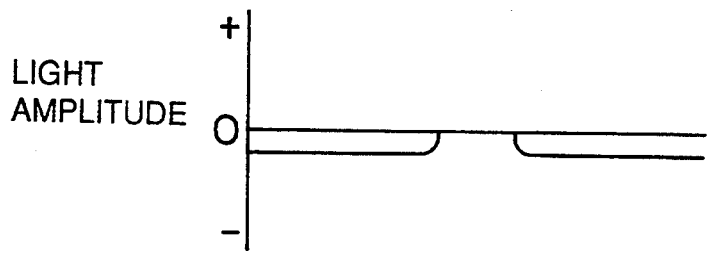
FIG. 22C shows amplitude of light passing through the phase shifter portion of the photomask of FIG. 22A.
Figure 22D:
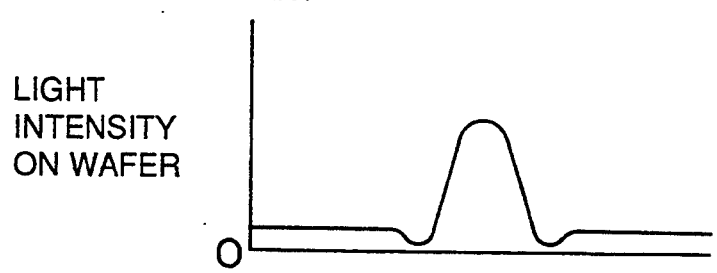
FIG. 22D shows light intensity on a semiconductor wafer in the case where the light shown in FIGS. 22B and 22C are merged.
Figure 22E:
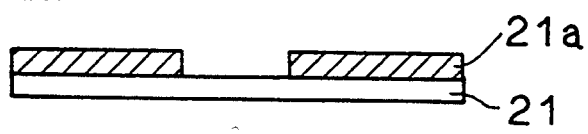
FIG. 22E shows the resist pattern formed by the photomask of FIG. 22A.
Figure 23A:
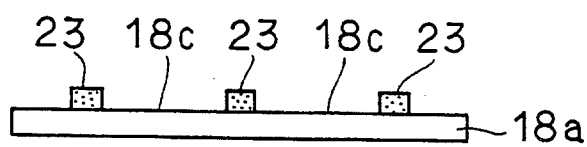
FIG. 23A is a sectional view of a photomask according to a fourth conventional art.
Figure 23B:
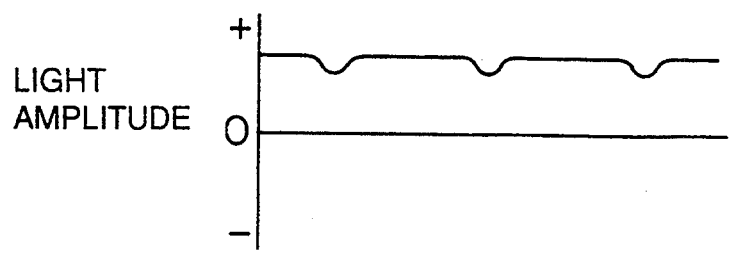
FIG. 23B shows amplitude of light passing through the light transmitting portion of the photomask of FIG. 23A.
Figure 23C:
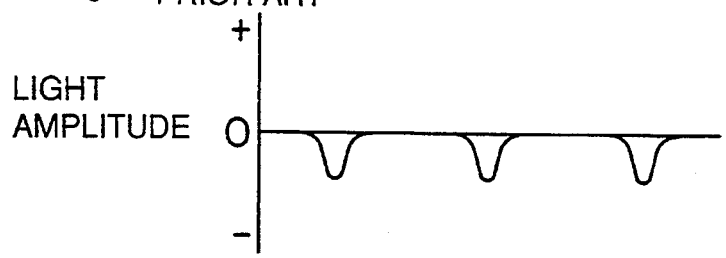
FIG. 23C shows amplitude of light passing through the phase shifter portion of the photomask of FIG. 23A.
Figure 23D:
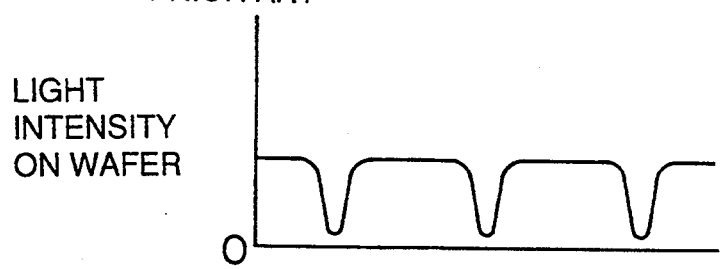
FIG. 23D shows light intensity on a semiconductor wafer when the light of FIGS. 23B and 23C are merged.
Figure 23E:
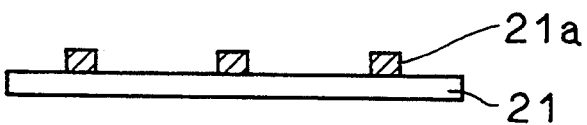
FIG. 23E shows the resist pattern formed by the photomask of FIG. 23A.
Figure 24A:
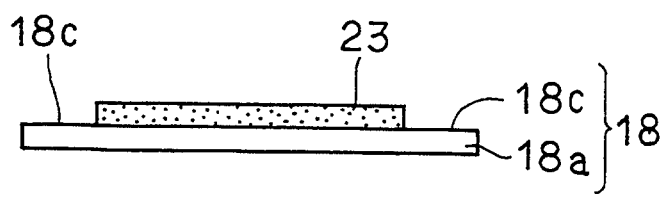
FIG. 24A is a sectional view of a photomask according to a fifth conventional art.
Figure 24B:
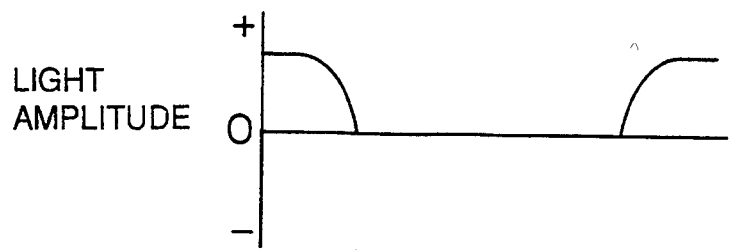
FIG. 24B shows amplitude of light passing through the light transmitting portion of the photomask of FIG. 24A.
Figure 24C:
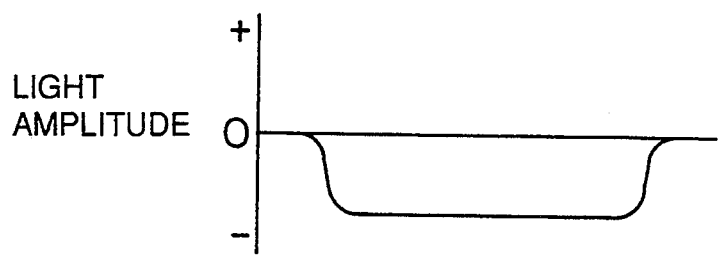
FIG. 24C shows amplitude of light passing through the phase shifter portion of the photomask of FIG. 24A.
Figure 24D:
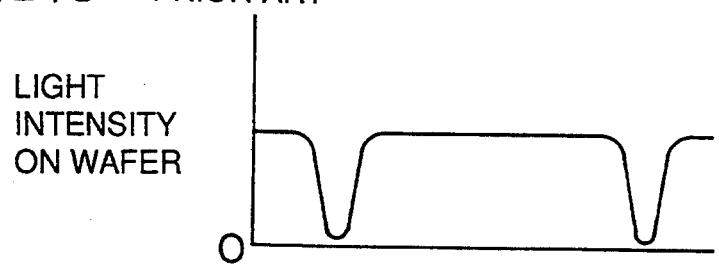
FIG. 24D shows light intensity on a semiconductor wafer in the case where the light shown in FIGS. 24B and 24C are merged.
Figure 24E:
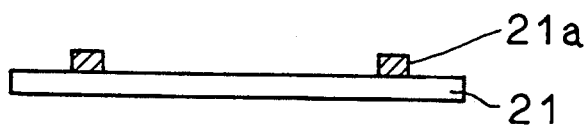
FIG. 24E shows the resist pattern formed by the photomask of FIG. 24A.
Figure 25A:
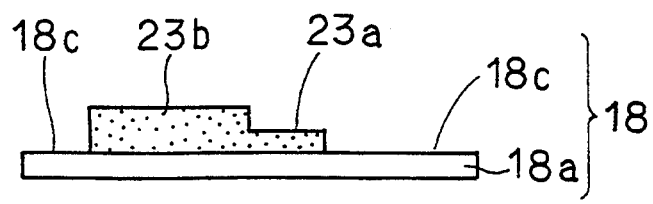
FIG. 25A is a sectional view of a photomask according to a sixth conventional art.
Figure 25B:
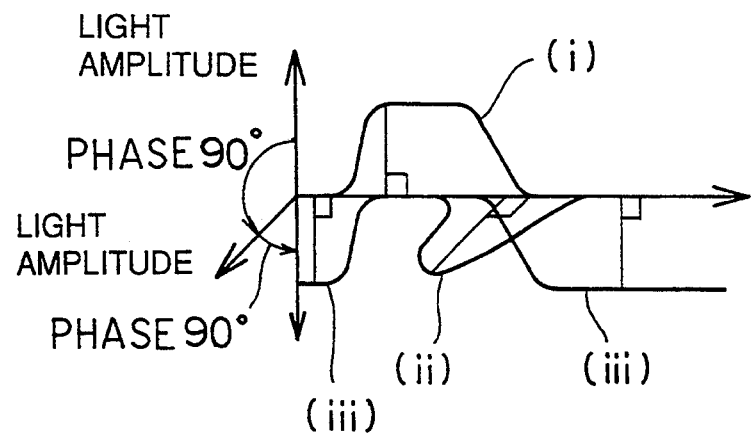
FIG. 25B shows amplitude of light passing through the photomask of FIG. 25A.
Figure 25C:
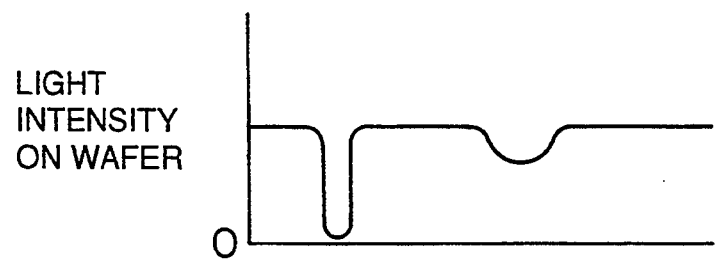
FIG. 25C shows intensity of the light of FIG. 25B on a semiconductor wafer.
Figure 25D:
FIG. 25 D shows as resist film on a semiconductor substrate.
Figure 26A:
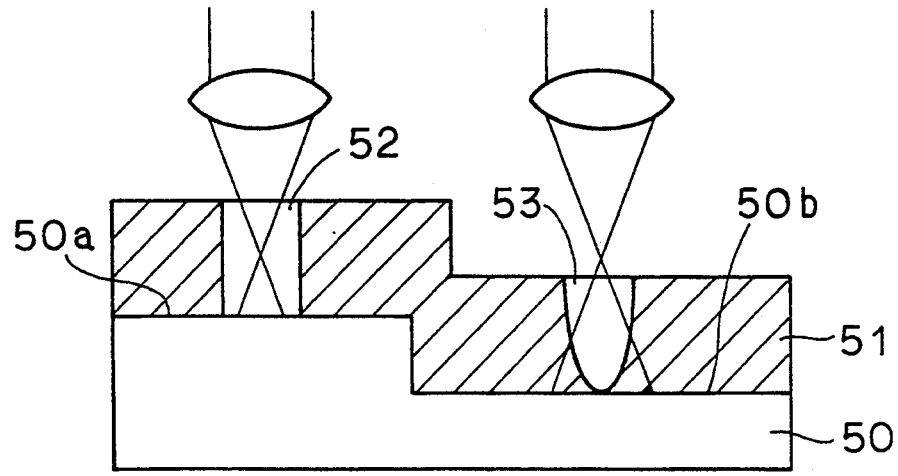
FIG. 26A is a diagram for describing problems when the focusing position is set to one area of a resist film including a stepped portion.
Figure 26B:
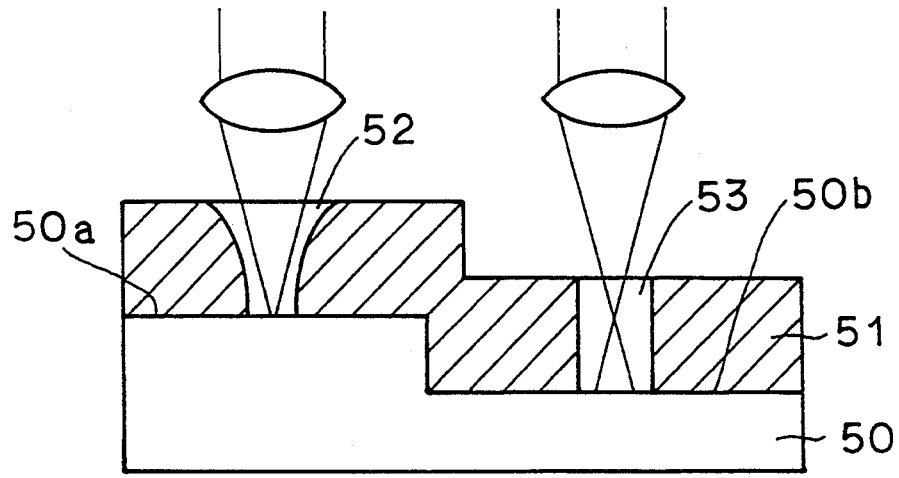
FIG. 26B is a diagram for describing problems when the focusing position is set to the other region on a resist film having a stepped portion.
Figure 26C:
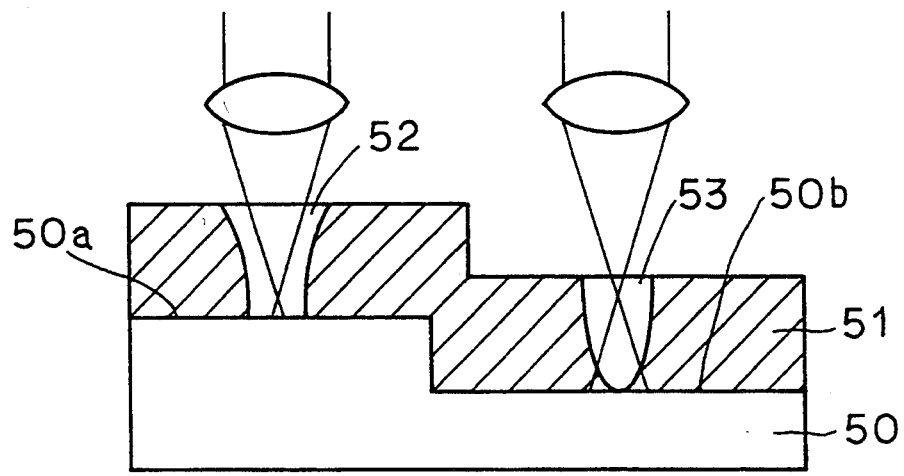
FIG. 26C is a diagram for describing problems when the focusing position is set to an intermediate area of the resist film having a stepped portion.
Figure 27A:
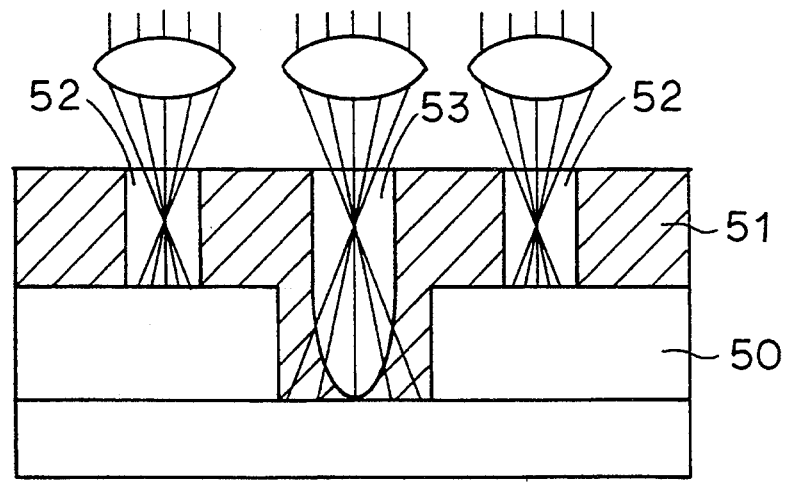
FIG. 27A is a diagram for describing a first problem in exposure in forming holes of different depth in a resist film.
Figure 27B:
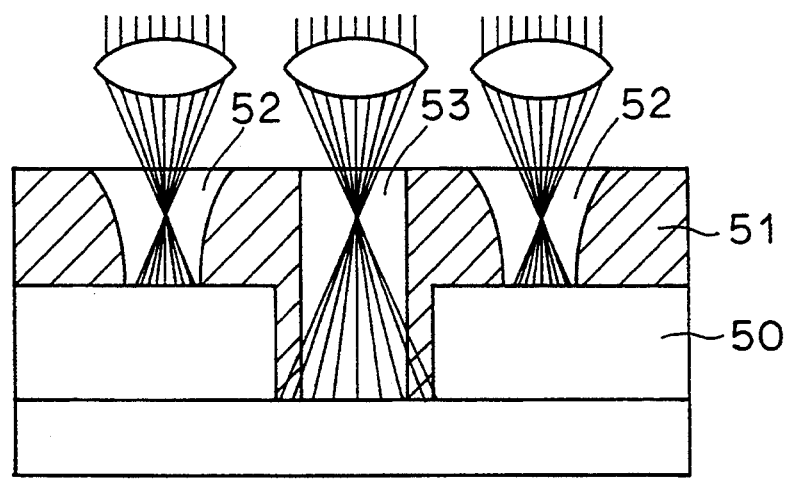
FIG. 27B is a diagram for describing a second problem at the time of exposure in forming holes of different depth in a resist film.
Figure 27C:
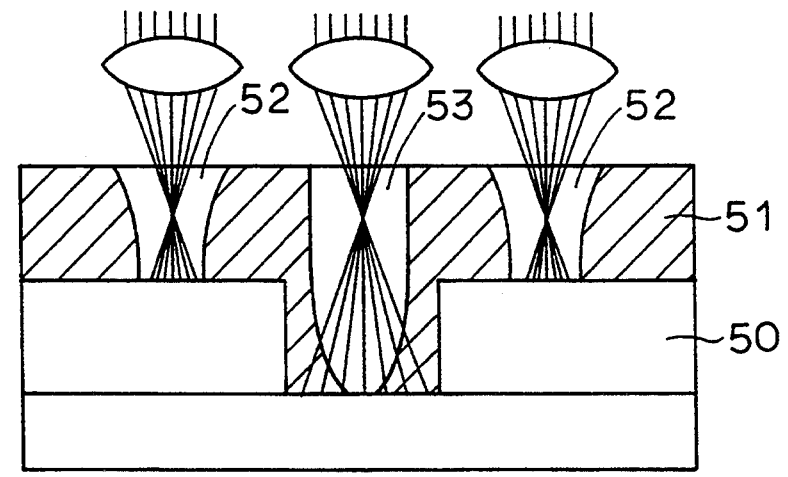
FIG. 27C is a diagram for describing a third problem at the time of exposure in forming holes of different depth in a resist film.

Referring to FIG. 16, an exposure apparatus includes a mercury lamp 11 which is the light source, a reflecting mirror 12, a focused lens 20, a fly eye lens 13, a diaphragm 14, a focused lens 16a, and a half mirror 30.

Light 11a emitted from light source 11 passes through fly eye lens 13 to be directed to half mirror 30. Light 11a directed to half mirror 30 is divided into a transmitted light 111a and a reflected light 111b.

In the light path of transmitted light 111a, a focused lens 16b, a reflecting mirror 17, focused lens 16c, first transmission type photomask 18a, a first mask stage 180a for mounting first transmission type photomask 18a, and a projection lens 19a are provided.

In the light path of reflected light 111b, a focused lens 16b, a reflecting mirror 17, a focused lens 16c, a second transmission type photomask 18b, a second mask stage 188b for mounting second transmission type photomask 18b, and a projection lens 19a are provided.

Transmitting light 111a and reflected light 111b going through respective light paths are merged by half mirror 30 to form an exposure light 111c.

Exposure light 111c is directed to a resist film 21a by projection lens 19b.

According to the above-described projection type exposure apparatus, an effect similar to those of the first—thirteenth embodiments can be obtained.

In the case where a reflective type photomask is used, the second reflective type photomask is disposed at a position shifted by λ/4 to provide a light path difference of λ/2 between the first and second reflective type photomasks. In the case where a projection type photomask is used, a similar effect can be obtained by shifting the second reflective type photomask by λ/2.

The focusing positions of light passing through the first and second projection type photomask can be differentiated by shifting the position of one of the projection type photomask by a predetermined distance.

Although the present invention has been described and illustrated in detail, it is clearly understood that the same is by way of illustration and example only and is not to be taken by way of limitation, the spirit and scope of the present invention being limited only by the terms of

What is claimed is:

1. An exposure apparatus comprising:

a first mask stage for mounting a first photomask, a second mask stage for mounting a second photomask, first light guiding means for guiding a pattern of light from said first photomask to a substrate to be exposed, and second light guiding means for guiding a pattern of light from said second photomask to said substrate to be exposed.

2. The exposure apparatus according to claim 1, wherein one of said first light guiding means and said second light guiding means includes a half mirror disposed within the light path of the other of said first and second light guiding means.

3. The exposure apparatus according to claim 1, wherein the light guided by said first light guiding means is light reflected on said first photomask, and the light guided by said second light guiding means is light reflected on said second photomask.

4. The exposure apparatus according to claim 1, wherein the light guided by said first light guiding means is light passing through said first photomask, and the light guided by said second light guiding means is light passing through said second photomask.

5. The exposure apparatus according to claim 1, wherein the light output from said first photomask and the light output from said second photomask are provided from the same light source, wherein the light output from said light source is divided into two by a half mirror, one being reflected on said first photomask and the other being reflected on said second photomask.

6. The exposure apparatus according to claim 1, wherein the light output from said first photomask and the light output from said second photomask are provided from the same light source, wherein the light from said light source is divided into two by a half mirror, one passing through said first photomask and the other passing through said second photomask.

7. The exposure apparatus according to claim 1, wherein said first and second mask stages are disposed so that the pattern of light from said first photomask and the pattern of light from said second photomask differ in phase.

8. The exposure apparatus according to claim 1, wherein said first and second mask stages are disposed so that the focusing position of light from said first photomask differs from that of light from said second photomask.

9. The exposure apparatus according to claim 1, wherein the pattern of light from said first photomask includes a pattern that partially enhances the light intensity of the pattern of light from said second photomask.

10. An exposure apparatus comprising:

a light source for emitting light for exposure, a half mirror for dividing the light emitted from said light source into a reflected light and a transmitted light, a first mask stage located within the light path of said reflected light, for mounting a first reflective type photomask having a predetermined pattern to reflect said reflected light to a substrate to be exposed, and a second mask stage located within a light path of said transmitted light for mounting a second reflective type photomask having a predetermined pattern to reflect said transmitted light to the substrate to be exposed.

11. The exposure apparatus according to claim 10, wherein said first reflective type photomask comprises a reflective pattern of a reflecting portion and a transmitting portion on a mask substrate, said second reflective type photomask comprises a reflective pattern that passes through all the light directed to the mask substrate.

12. The exposure apparatus according to claim 10, wherein said first reflective type photomask comprises a reflective pattern of a reflecting portion and a transmitting portion on a mask substrate, and wherein said second reflective type photomask comprises a reflective pattern that reflects all the directed light, said second reflective type photomask being disposed at a position shifted by $\lambda/4$ to provide a phase difference of $\lambda/2$ to light reflected on said second reflective type photomask with respect to light reflected on said first reflective type photomask.

13. The exposure apparatus according to claim 10, wherein said first reflective type photomask comprises a reflective pattern of a reflecting portion and a transmitting portion alternately on a mask substrate, and said second reflective type photomask comprises a reflective pattern identical to that of said first reflective type photomask on the mask substrate.

14. The exposure apparatus according to claim 10, wherein said first reflective type photomask comprises a predetermined reflective pattern of a reflecting portion and a transmitting portion on a mask substrate, and wherein said second reflective type photomask comprises a reflective pattern having the pattern of said first reflective type photomask converted by 90° on the mask substrate, said second reflective type photomask being disposed at a position shifted by $\lambda/4$ so as to provide a phase difference of $\lambda/2$ to light reflected on said first reflective type photomask with respect to light reflected on said first reflective type photomask.

15. The apparatus according to claim 10, wherein said first reflective type photomask comprises a reflective pattern having a reflecting portion at a predetermined position on a mask substrate, wherein said second reflective type photomask comprises a reflective pattern including a pair of reflecting portions at an interval wider than the width of reflecting portion of said first reflective type photomask, said second reflective photomask being disposed at a position shifted by $\lambda/4$ so as to provide a phase difference $\lambda/2$ to light reflected on said first reflective type photomask with respect to light reflected on said first reflective type photomask.

16. The exposure apparatus according to claim 10, wherein said reflective photomask comprises a reflective pattern having a reflecting portion at a predetermined position on a mask substrate, wherein said second reflective type photomask comprises a reflective pattern having a pair of reflecting portions having an interval identical to the width of the reflecting portion of said first reflective type photomask on the mask substrate, said second reflective type photomask being disposed at a position shifted by λ/4 so as to provide a phase difference of λ/2 to light reflected on said second reflective type photomask with respect to light reflected on said first reflective type photomask.

17. The exposure apparatus according to claim 10, wherein said first reflective type photomask comprises a reflective pattern having a reflecting portion on a mask substrate,
- wherein said second reflective type photomask comprises a reflective pattern including a transmitting portion of a width substantially equal to that of said reflecting portion of said first reflective type photomask at a position corresponding to said reflecting portion and a reflecting portion of a predetermined reflectance sandwiching said transmitting portion from both sides,
- said second reflective type photomask being disposed at a position shifted by λ/4 so as to provide a phase difference λ/2 to light reflected on said second reflective type photomask with respect to light reflected on said first reflective type photomask.

18. The exposure apparatus according to claim 10, wherein said first reflective type photomask comprises a reflective pattern including a first reflecting portion on a mask substrate, a second reflecting portion having a stepped portion of λ/8 with respect to said first reflecting portion, and a transmitting portion,
- wherein said second reflective type photomask comprises a reflective pattern including a reflecting portion at a position corresponding to said second reflecting portion of said first reflective type photomask on a mask substrate,
- said second reflective type photomask being disposed at a position shifted by λ/4 so as to provide a phase difference of λ/2 to light reflected on said second reflective type photomask with respect to light reflected on said first reflecting portion of said first reflective type photomask.

19. The exposure apparatus according to claim 10, wherein said first reflective type photomask comprises a reflective pattern of a reflecting portion and a transmitting portion on a mask substrate,
- wherein said second reflective type photomask comprises a reflective pattern which is an inversion of the reflective pattern of said first reflective type photomask,
- said second reflective type photomask being disposed at a position shifted by λ/4 so as to provide a phase difference of λ/2 to light reflected on said second reflective type photomask with respect to light reflected on said first reflective type photomask.

20. The exposure apparatus according to claim 10, wherein said first reflective type photomask comprises a reflective pattern including a transmitting portion at a predetermined position on a mask substrate and a reflecting portion at both sides thereof,
- wherein said second reflective type photomask comprises a reflective pattern which is an inversion of the reflective pattern of said first reflective type photomask,
- said second reflective type photomask being disposed at a position shifted by λ/4 so as to provide a phase difference of λ/2 to light reflected on said second reflected type photomask with respect to light reflected on said first reflective type photomask.

21. The exposure apparatus according to claim 10, wherein said first and second reflective type photomasks respectively comprise a reflective pattern having a reflecting portion formed at each corresponding predetermined position on a mask substrate,
- said second reflective type photomask being disposed with respect to said first reflective type photomask so that the focusing position on said substrate is shifted in the thickness direction of the substrate.

22. The exposure apparatus according to claim 10, wherein said first reflective type photomask comprises a reflective pattern including a reflecting portion at a predetermined position on a mask substrate,
- wherein said second reflective type photomask comprises a reflective pattern shifted in position with respect to a position corresponding to the reflective pattern of said first reflective type photomask,
- said second reflective type photomask being disposed with respect to said first reflective type photomask so that the focusing position on said substrate is shifted in the direction of the thickness of the substrate.

23. The exposure apparatus according to claim 10, wherein
- said first reflective type photomask comprises a reflective pattern including a plurality of reflecting portions and transmitting portions on a mask substrate,
- said second reflective type photomask comprises at least one reflecting portion overlapping said plurality of reflecting portions on the mask substrate.

24. The exposure apparatus according to claim 23, wherein said second reflective type photomask is disposed with respect to said first reflective type photomask so that the focusing position on the substrate is shifted in the direction of thickness of the substrate.

* * * * *